United States Patent
Takada

(10) Patent No.: US 11,137,793 B2
(45) Date of Patent: Oct. 5, 2021

(54) SEMICONDUCTOR INTEGRATED CIRCUIT, RECEIVER DEVICE, AND METHOD FOR CONTROLLING SEMICONDUCTOR INTEGRATED CIRCUIT

(71) Applicant: Kioxia Corporation, Minato-ku (JP)

(72) Inventor: Shuichi Takada, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 26 days.

(21) Appl. No.: 16/817,386

(22) Filed: Mar. 12, 2020

(65) Prior Publication Data

US 2021/0080994 A1    Mar. 18, 2021

(30) Foreign Application Priority Data

Sep. 18, 2019    (JP) .............................. JP2019-169687

(51) Int. Cl.
| | |
|---|---|
| *G06F 1/08* | (2006.01) |
| *G06F 1/12* | (2006.01) |
| *H04B 1/16* | (2006.01) |
| *H03L 7/099* | (2006.01) |
| *H03L 7/089* | (2006.01) |

(52) U.S. Cl.
CPC ................. *G06F 1/08* (2013.01); *G06F 1/12* (2013.01); *H03L 7/0891* (2013.01); *H03L 7/099* (2013.01); *H04B 1/16* (2013.01)

(58) Field of Classification Search
CPC combination set(s) only.
See application file for complete search history.

(56) References Cited

U.S. PATENT DOCUMENTS

| | | | |
|---|---|---|---|
| 7,508,892 B2 | 3/2009 | Kibune et al. | |
| 8,054,876 B2* | 11/2011 | Tsai ....................... | H03H 11/28 375/233 |
| 8,483,263 B2 | 7/2013 | Aoki | |
| 8,619,848 B2* | 12/2013 | Jiang ................. | H04L 25/03057 375/233 |
| 8,879,615 B1* | 11/2014 | Gagnon ........... | H04L 25/03305 375/226 |
| 10,880,129 B2* | 12/2020 | Eimitsu ............. | H04L 25/03885 |
| 2010/0135378 A1* | 6/2010 | Lin ....................... | H04L 7/0331 375/233 |
| 2012/0023363 A1* | 1/2012 | Shaeffer ................... | G11C 7/10 714/6.11 |
| 2018/0046213 A1* | 2/2018 | Sakurai ..................... | G06F 1/04 |
| 2018/0059156 A1* | 3/2018 | Zabolotov .............. | H04B 17/29 |

(Continued)

FOREIGN PATENT DOCUMENTS

| | | |
|---|---|---|
| JP | 2008-270864 A | 11/2008 |
| JP | 4331641 B2 | 9/2009 |
| JP | 4848035 B2 | 12/2011 |

*Primary Examiner* — Adam D Houston
(74) *Attorney, Agent, or Firm* — Oblon, McClelland, Maier & Neustadt, L.L.P.

(57) ABSTRACT

According to one embodiment, there is provided a semiconductor integrated circuit including a first equalizer and a clock reproduction circuit. The first equalizer boosts a data signal. The clock reproduction circuit extracts from the boosted data signal information of a pair consisting of a rise edge and a fall edge which are temporarily separated from each other by N or more times (N is an integer of two or higher) as much as a clock cycle, performs a phase adjustment based on the information about the pair of the rise edge and the fall edge, and reproduces a clock.

20 Claims, 13 Drawing Sheets

(56) References Cited

U.S. PATENT DOCUMENTS

| | | | |
|---|---|---|---|
| 2018/0083607 A1* | 3/2018 | Kanomata | H04L 25/03885 |
| 2018/0183633 A1* | 6/2018 | Ho | H04L 7/033 |
| 2019/0042380 A1* | 2/2019 | Das Sharma | G06F 13/4295 |
| 2019/0149315 A1* | 5/2019 | Suzuki | H04L 25/03146 |
| | | | 375/233 |
| 2020/0280458 A1* | 9/2020 | Lam | H04L 25/03885 |
| 2020/0295871 A1* | 9/2020 | Lu | H04L 25/03203 |
| 2020/0304351 A1* | 9/2020 | Eimitsu | H04L 25/03057 |
| 2021/0051049 A1* | 2/2021 | Bae | H03K 7/08 |
| 2021/0080994 A1* | 3/2021 | Takada | G06F 1/08 |
| 2021/0083706 A1* | 3/2021 | Iwai | H04B 1/24 |

\* cited by examiner

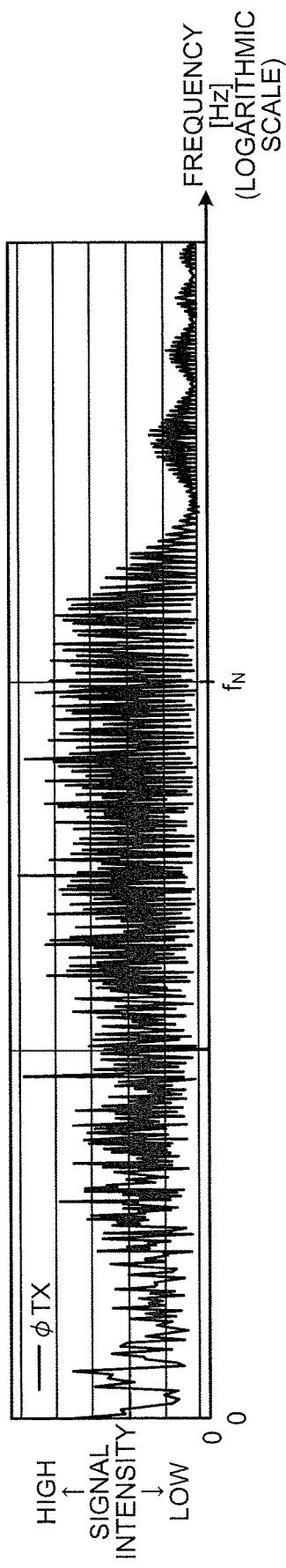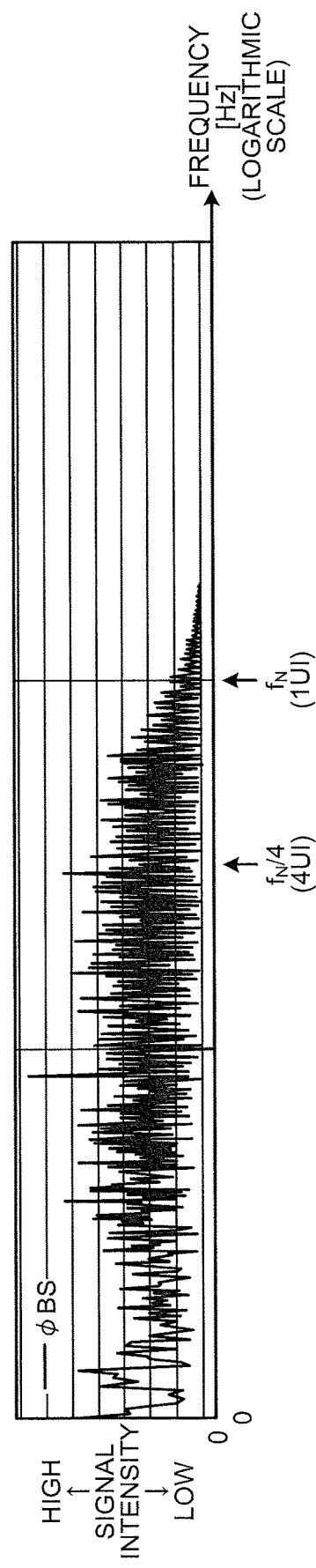

EDGE INFORMATION

SEMICONDUCTOR INTEGRATED CIRCUIT, RECEIVER DEVICE, AND METHOD FOR CONTROLLING SEMICONDUCTOR INTEGRATED CIRCUIT

CROSS-REFERENCE TO RELATED APPLICATIONS

This application is based upon and claims the benefit of priority from Japanese Patent Application No. 2019-169687, filed on Sep. 18, 2019; the entire contents of which are incorporated herein by reference.

FIELD

Embodiments described herein relate generally to a semiconductor integrated circuit, a receiver device, and a method for controlling a semiconductor integrated circuit.

BACKGROUND

In a receiver device including a clock reproduction circuit, a clock signal for acquiring data from a received signal is reproduced. At this time, it is desired to reproduce the clock signal appropriately.

BRIEF DESCRIPTION OF THE DRAWINGS

FIGS. 2A and 2B illustrate frequency characteristics of a transmitted data signal and of a received and then boosted data signal in the embodiment;

DETAILED DESCRIPTION

In general, according to one embodiment, there is provided a semiconductor integrated circuit comprising a first equalizer and a clock reproduction circuit. The first equalizer boosts a data signal. The clock reproduction circuit extracts from the boosted data signal information of a pair of a rise edge and a fall edge which are temporarily separated from each other by N or more times (N is an integer of two or higher) as much as a clock cycle, performs a phase adjustment based on the information about the pair of the rise edge and the fall edge, and reproduces a clock.

Exemplary embodiments of a semiconductor integrated circuit, a receiver device, and a method for controlling a semiconductor integrated circuit will be explained below in detail with reference to the accompanying drawings. The present invention is not limited to the following embodiments.

EMBODIMENT

Figure 1:
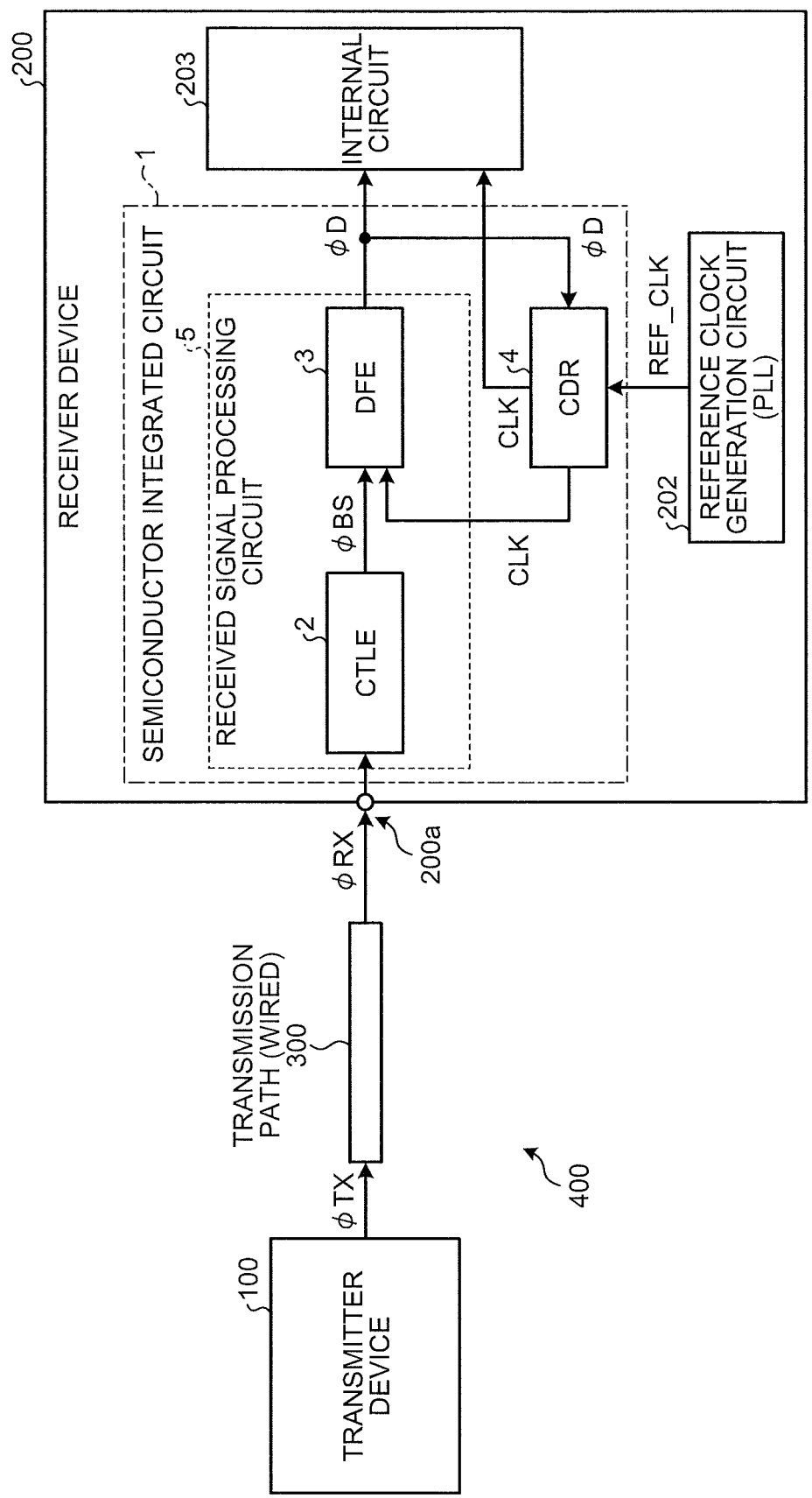
FIG. 1 is a block diagram illustrating a configuration of a communication system including a receiver device to which a semiconductor integrated circuit according to one embodiment has been applied.

A receiver device 200 including a semiconductor integrated circuit 1 according to an embodiment will be described with reference to FIG. 1. FIG. 1 illustrates a configuration of a communication system 400 including the receiver device 200 including the semiconductor integrated circuit 1.

The communication system 400 includes a transmitter device 100, the receiver device 200, and a wired communication path 300. The transmitter device 100 and the receiver device 200 are connected to enable communication via the wired communication path 300 serving as a transmission path. The transmitter device 100 transmits data via the wired communication path 300 to the receiver device 200. The receiver device 200 includes a receiver node 200a to which the wired communication path 300 can be connected and receives data via the wired communication path 300 from the transmitter device 100. The receiver device 200 includes the semiconductor integrated circuit 1, a reference clock generation circuit 202, and an internal circuit 203. The semiconductor integrated circuit 1 includes a received signal processing circuit 5 and a clock data recovery (CDR) circuit 4. The received signal processing circuit 5 includes a continuous time linear equalizer (CTLE) circuit 2 and a decision feedback equalizer (DFE) circuit 3.

The transmitter device 100 performs predetermined modulation (for example, binary modulation such as NRZ or pulse amplitude modulation <PAM>) to data to be transmitted in a state in which edge information of a clock is embedded in the data to generate a modulated signal and transmits the signal to the receiver device 200 as a data signal φTX. As illustrated in FIG. 2A, the data signal φTX has desired signal intensity in a range from a low-frequency area to Nyquist frequency (in the NRZ, frequency which is half or less the data transmission rate) $f_N$. FIG. 2A illustrates frequency characteristics of the data signal φTX transmitted from the transmitter device 100 and illustrates a result obtained by performing FFT (Finite Fourier Transform) processing to the data signal φTX.

A data signal φRX received in the receiver node 200a after the data signal φTX has passed through the wired communication path 300 is subject to a channel loss due to by a skin effect of a conductor, a dielectric loss, and the like in the wired communication path 300, and a radio-frequency component of the signal intensity is likely to attenuate from the desired signal intensity. To compensate for the attenuation, the received signal processing circuit 5 illustrated in FIG. 1 boosts the data signal φRX in the CTLE circuit 2, and a data signal φBS boosted in the CTLE circuit 2 is likely to attenuate significantly at the Nyquist frequency $f_N$ or higher as illustrated in FIG. 2B. FIG. 2B illustrates frequency characteristics of the data signal φBS received and then boosted in the CTLE circuit 2 and illustrates a result obtained by performing the FFT processing to the data signal φBS.

Meanwhile, each data signal can be a differential signal. In the embodiments, although signal lines and circuit components on a differential P side are described for simplification, signal lines and circuit components on a differential N side can have similar configurations.

In an initial operation at the time of activation or the like of the receiver device 200, control to make a boost amount of the CTLE circuit 2 appropriate can be performed. In some cases, feedback control is performed based on output indices (an amplitude or a pulse width) of the CTLE circuit 2. At this time, a transmitter side and a receiver side are in asynchronous states. To improve accuracy of the feedback control, it is desired to synchronize the transmitter side with the receiver side to reduce mixture of uncertain information (noise) into the indices (the amplitude or the pulse width) of the output.

To synchronize the transmitter side with the receiver side, the CDR circuit 4 reproduces a clock CLK by using a data signal φD from the received signal processing circuit 5 and a reference clock REF_CLK from the reference clock generation circuit 202. The reference clock generation circuit 202 may be a phase locked loop (PLL). The CDR circuit 4 determines based on the reference clock REF_CLK whether a phase of the clock CLK leads or lags as compared with an edge information extracted from the data signal φD, and adjusts the phase of the clock CLK based on the determination result. For example, in a case in which the phase of the clock CLK lags behind an edge timing of the data signal φD, the CDR circuit 4 makes the phase of the clock CLK lead. In a case in which the phase of the clock CLK leads ahead of the edge timing of the data signal φD, the CDR circuit 4 makes the phase of the clock CLK lag. The CDR circuit 4 can be locked in a state in which the phase of the clock CLK matches the edge timing of the data signal φD. In this manner, a clock CLK corresponding to the edge information embedded in the data signal φD can be reproduced.

However, in an asynchronous state, setting of the CTLE circuit 2 may not be appropriate. For example, in a case in which the data signal φBS boosted in the CTLE circuit 2 includes an ISI (Inter-Symbol Interference) jitter, the CDR circuit 4 may be in an erroneous lock state, in which the CDR circuit 4 is locked at an erroneous edge timing, or in an unstable state, in which the edge timing varies to make the CDR circuit 4 difficult to be locked. As a result, it is difficult to acquire information required to take control to make the CTLE circuit 2 appropriate and to lock the CDR circuit 4.

Figure 3A:
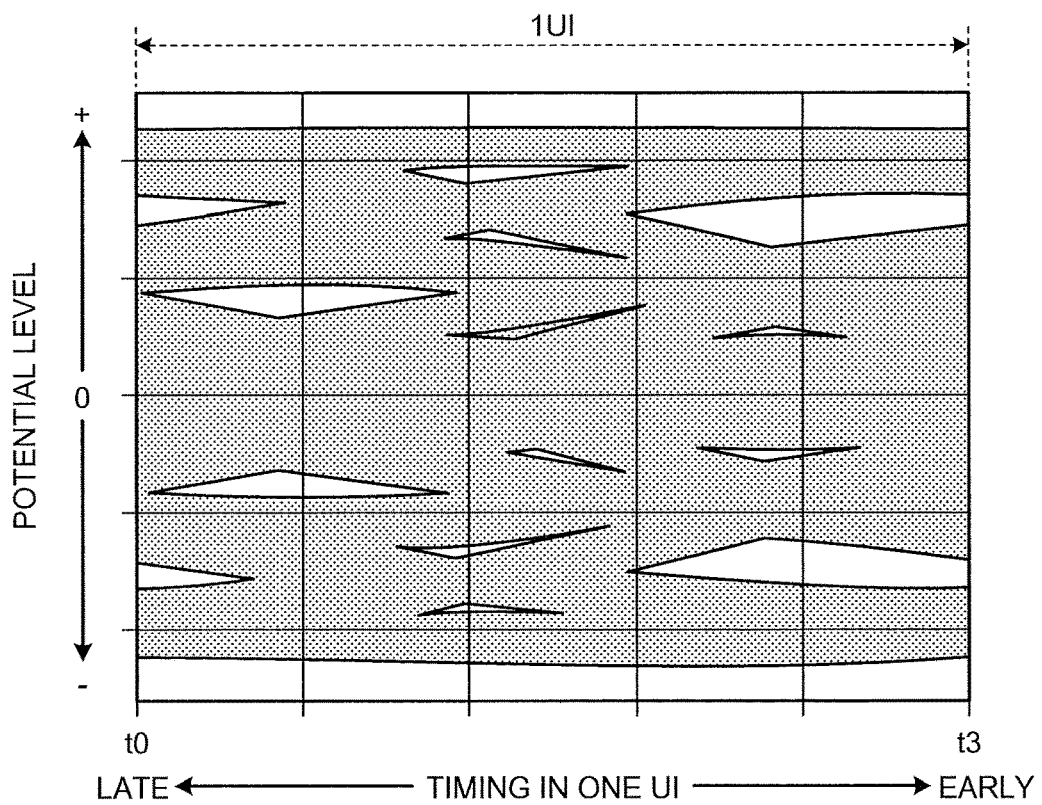
FIGS. 3A and 3B illustrate distribution of edge timings of the received and then boosted data signal in the embodiment.
Figure 3B:
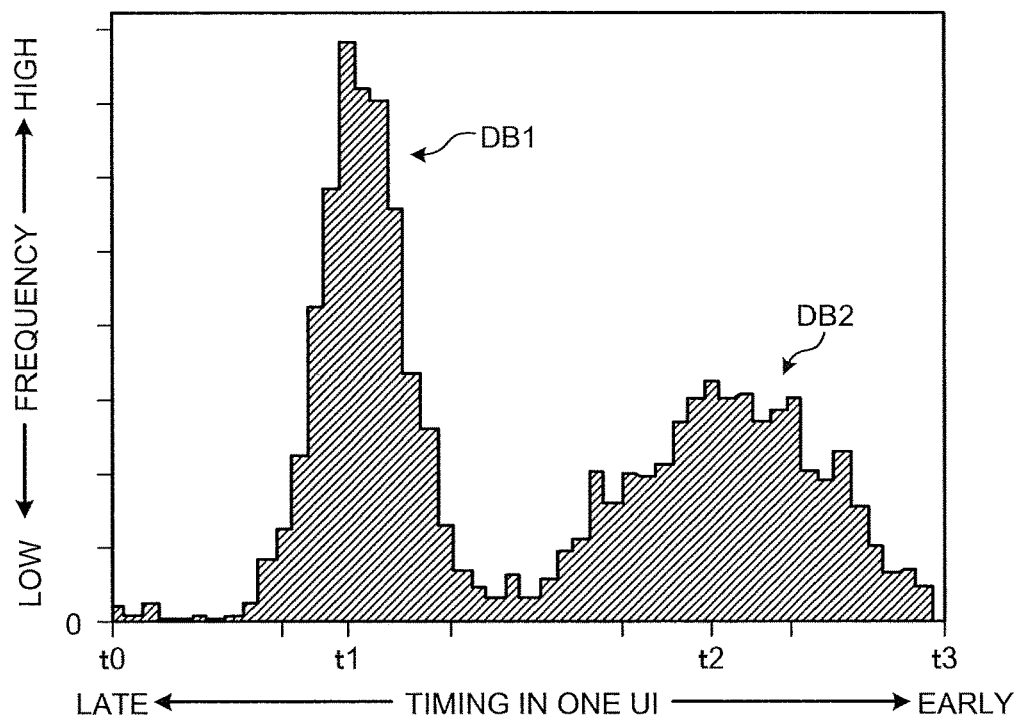

For example, in the data signal φBS boosted in the CTLE circuit 2, an eye pattern thereof may be in a closed state as illustrated in FIG. 3A. However as for a zero cross edge, an edge part (that is, a part in which a potential level zero-crosses from the − side to the + side, or a part in which the potential level zero-crosses from the + side to the − side) can clearly be confirmed. FIG. 3A illustrates a distribution of edge timings of the boosted data signal φBS as the eye pattern. When the edge timing is examined further in detail, as illustrated in FIG. 3B, it is found that, as for an appearance frequency of edge timings in one unit interval (UI), a plurality of distributions DB1 and DB2 appear. FIG. 3B illustrates the distribution of the edge timings of the boosted data signal φBS as the histogram. One UI is a unit interval for waveform processing and corresponds to half cycle or one cycle of the clock CLK. The distribution DB1 has a peak around a timing t1 within one UI, and the distribution DB2 has a peak around a timing t2 within one UI. In each of FIGS. 3A and 3B, the edge timings are collected in a plurality of UIs and illustrated in one UI ranging from a timing t0 to a timing t3. The horizontal axis in each of FIGS. 3A and 3B represents a timing in one UI. The vertical axis in FIG. 3A represents a potential level of the data signal φBS, and the vertical axis in FIG. 3B represents a frequency (the number of times of appearance).

As illustrated in FIG. 3B, the distribution DB1 is steeper than the distribution DB2. A peak of the distribution DB1 is higher than a peak of the distribution DB2 (that is, the appearance frequency is higher). This leads to an idea that the distribution DB1 corresponds to correct edge timings, and that the distribution DB2 corresponds to degraded radio-frequency components caused by the ISI. In a case in which a clock CLK is to be reproduced in the CDR circuit 4 with use of the data signal φD output from the received signal processing circuit 5 based on the data signal φBS, the CDR circuit 4 may be locked erroneously at the timing t2 in the distribution DB2. Since the total areas of the distribution DB1 and the distribution DB2 are approximately equal, it is difficult to switch the timing t2 for the distribution DB2, at which the CDR circuit 4 is locked, to the timing t1 for the distribution DB1.

Here, a part of the waveform of a data signal in which the potential level zero-crosses is referred to as an edge. Further, in a case in which, in the waveform of the data signal, after a part in which the potential level zero-crosses from the − side to the + side (rise edge) appears, a part in which the potential level zero-crosses from the + side to the − side (fall edge) appears, a pair consisting of the rise edge and the fall edge detected in the CDR circuit 4 in order (in a consecutive order) is referred to as a pair. Also, in a case in which, in the waveform of the data signal, after a part in which the potential level zero-crosses from the + side to the − side (fall edge) appears, a part in which the potential level zero-crosses from the − side to the + side (rise edge) appears, a pair consisting of the fall edge and the rise edge detected in the CDR circuit 4 in order (in a consecutive order) is referred to as a pair.

Figure 7A:
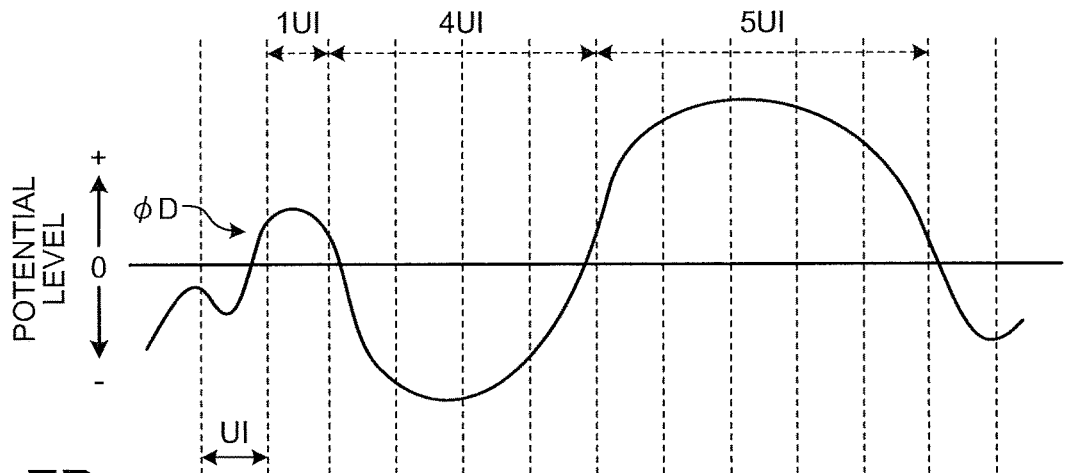
FIGS. 7A to 7D illustrate information relating to a pair of a rise edge and a fall edge in the embodiment.

The waveform of the data signal has a pair having a long time interval between the edges and a pair having a short time interval between the edges (for example, in a waveform illustrated in FIG. 7A, a rise edge around a timing t12 and a fall edge around a timing t13 constitute a pair having a short time interval, and a fall edge around the timing t13 and a rise edge around a timing t17 constitute a pair having a long time interval). When the distribution DB1 illustrated in FIG. 3B, which seems to correspond to correct edge timings, is further considered, it has been found that, when N is an integer of two or higher, the distribution DB1 has many pairs each consisting of the edges that are temporarily separated from each other N or more times as much as one UI.

For example, as illustrated in FIG. 2B, in the boosted data signal φBS, the signal intensity significantly attenuates at the Nyquist frequency $f_N$ or higher, and the signal intensity can be equivalent to that at the time of transmission at frequency $f_N/N$, which is 1/N of the Nyquist frequency $f_N$, or lower. FIG. 2B, in which the horizontal axis represents frequency expressed in logarithmic scale, illustrates a case in which, when N=4, the signal intensity of the boosted data signal φBS can be equivalent to that at the time of transmission at frequency $f_N/4$, which is ¼ of the Nyquist frequency $f_N$. It can be inferred from the above that the distribution DB1 hardly has a pair consisting of the edges that are temporarily separated in one UI but has many pairs in which the edges are temporarily separated N or more times as much as one UI (pairs each containing a low-frequency component).

Under such circumstances, in the present embodiment, in the semiconductor integrated circuit 1, a pair containing a low-frequency component is extracted in the CDR circuit 4 from the data signal φBS boosted in the CTLE circuit 2, and the phase of the clock CLK is adjusted in the CDR circuit 4 with use of the information about the extracted pair, to make lock in the CDR circuit 4 appropriate.

Specifically, in an initial operation of the received signal processing circuit 5, edge detection is performed in the CDR circuit 4 on the data signal φD obtained after the data signal φBS received and then boosted has passed the DFE circuit 3. The CDR circuit 4 extracts from all of the detected edges a pair consisting of the adjacent edges that are temporarily separated N or more times as much as one UI (N is an integer of two or higher) (pair containing a low-frequency component). The CDR circuit 4 performs first phase adjustment based on the information about the pair containing a low-frequency component. To compensate for followability of the CDR circuit 4 even with lowered edge density, the CDR circuit 4 multiplies a control amount derived with use of the pair containing a low-frequency component by N and uses the value as a control amount for the first phase adjustment. The CDR circuit 4 generates a clock based on the control amount for the first phase adjustment. The CDR circuit 4 uses the pair containing a low-frequency component in which the edge density has been lowered to 1/N and performs adjustment of the control amount corresponding to multiplication of the frequency by N. That is, the semiconductor integrated circuit 1 performs adaptive control (rough adaptive control) for making the boost amount of the CTLE circuit 2 appropriate while the CDR circuit 4 is locked with use of the pair containing a low-frequency component. As a result, the CDR circuit 4 can be locked roughly. When the boost amount of the CTLE circuit 2 is made to be appropriate, the semiconductor integrated circuit 1 ends the adaptive control for the CTLE circuit 2. Since the CDR circuit 4 is locked roughly, and feedback timing can be specified, the semiconductor integrated circuit 1 starts adaptive control for making a correction amount of the DFE circuit 3 appropriate. The CDR circuit 4 then performs second phase adjustment with use of all of the detected edges to generate a clock. That is, the semiconductor integrated circuit 1 performs adaptive control (fine adaptive control) for the DFE circuit 3 while the CDR circuit 4 is locked with use of all of the edges. As a result, the CDR circuit 4 can be locked finely. That is, in the semiconductor integrated circuit 1, stepwise improvement of accuracy of equalization and stepwise improvement of accuracy of phase adjustment for the clock can be performed in parallel, and lock of the CDR circuit 4 can efficiently be made to be appropriate.

Figure 4:
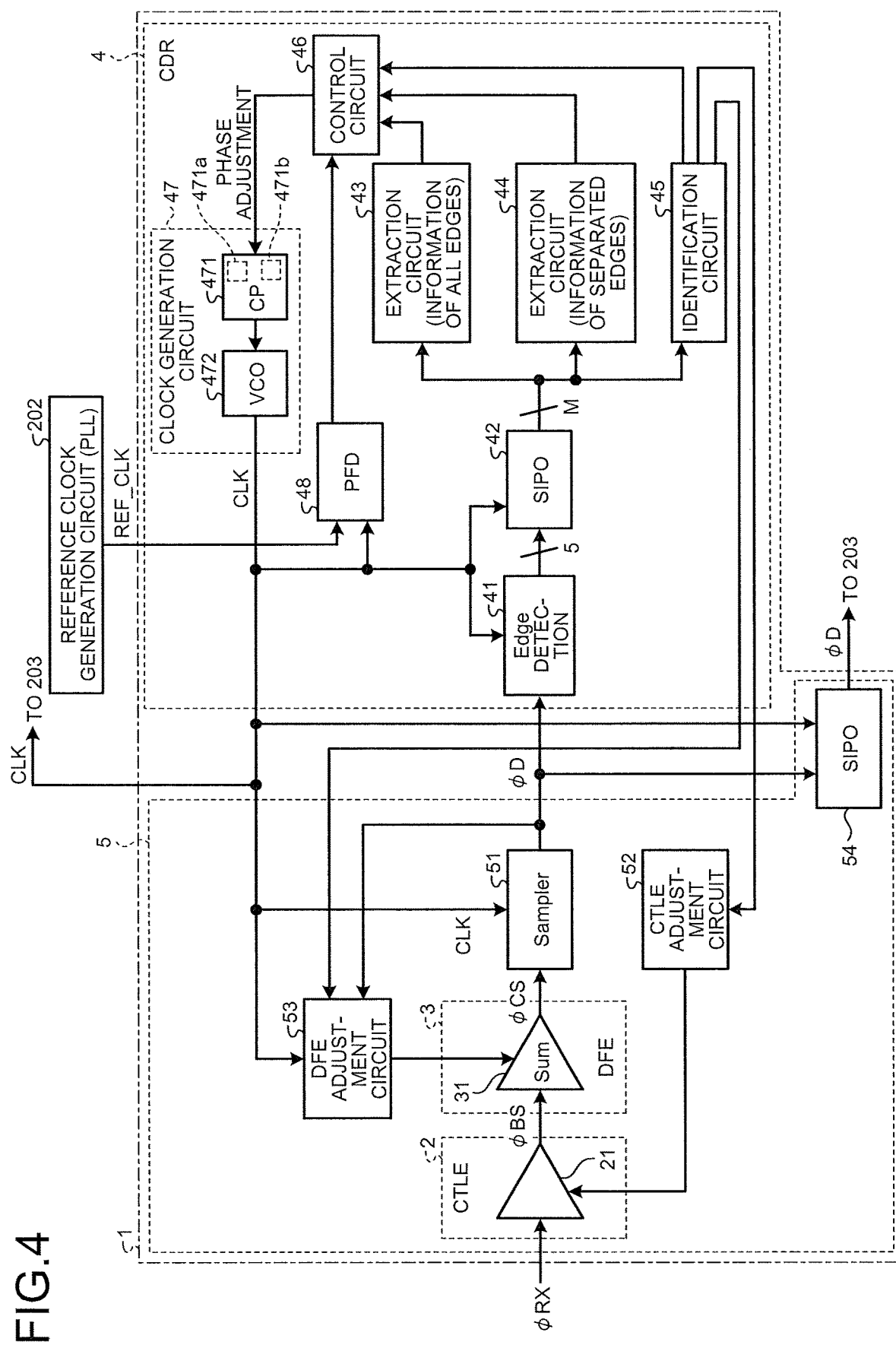
FIG. 4 illustrates a configuration of the semiconductor integrated circuit according to the embodiment.

More specifically, the semiconductor integrated circuit 1 can be configured as illustrated in FIG. 4. FIG. 4 illustrates a configuration of the semiconductor integrated circuit 1. The semiconductor integrated circuit 1 can be formed as one package or one or a plurality of chips (dies).

In the semiconductor integrated circuit 1, the received signal processing circuit 5 performs on the data signal φRX received in the receiver node 200a signal processing such as boost of the data signal φRX to generate the data signal φD and supplies the data signal φD to the CDR circuit 4 and the internal circuit 203. The received signal processing circuit 5 includes a sampler 51, a CTLE adjustment circuit 52, a DFE adjustment circuit 53, and a serial input parallel output (SIPO) circuit 54, as well as the CTLE circuit 2 and the DFE circuit 3.

When N is an integer of two or higher, the CDR circuit 4 extracts from a waveform of the data signal φD subjected to the signal processing such as boost information about a pair consisting of a rise edge and a fall edge which are temporarily separated from each other N or more times as much as a clock cycle. The CDR circuit 4 performs phase adjustment with use of information about the pair consisting of the rise edge and the fall edge and reproduces a clock. The CDR circuit 4 includes an edge detection circuit 41, a serial input parallel output (SIPO) circuit 42, an extraction circuit 43, an extraction circuit 44, an identification circuit 45, a control circuit 46, a clock generation circuit 47, and a phase frequency detector (PFD) circuit 48. The clock generation circuit 47 includes a charge pump (CP) circuit 471 and a voltage controlled oscillator (VCO) circuit 472.

In the semiconductor integrated circuit 1, a loop "PFD circuit 48→control circuit 46→clock generation circuit 47→PFD circuit 48" constitutes a loop for frequency lock of the clock CLK. A loop "control circuit 46→clock generation circuit 47→DFE circuit 3→sampler 51→edge detection circuit 41→SIPO circuit 42→extraction circuit 44 (or extraction circuit 43)→control circuit 46" constitutes a loop for phase lock of the clock CLK.

In the CDR circuit 4, frequency lock is performed with use of the PFD circuit 48 based on the reference clock REF_CLK from the reference clock generation circuit 202, and phase lock is then performed with use of the edge detection circuit 41. At this time, an output of the edge detection circuit 41 is parallelized in the SIPO circuit 42, and information about edges serving as a pair containing a low-frequency component is extracted in the extraction circuit 44 from the parallelized information. The pair containing a low-frequency component is a pair consisting of edges that are temporarily separated N or more times as much as one UI (N is an integer of two or higher), and the pair may be a pair consisting of a rise edge and a fall edge or a pair consisting of a fall edge and a rise edge. Meanwhile, in a waveform of a data signal, since it is impossible for the potential level to zero-cross from the − side to the + side without zero-crossing from the + side to the − side after zero-crossing from the − side to the + side, a pair consisting of the rise edge and the rise edge does not exist. A pair consisting of the fall edge and the fall edge does not exist for the similar reason.

The CDR circuit 4 makes the phase of the clock CLK lead or lag based on the extracted edge information to perform phase adjustment. The control circuit 46, which performs the phase adjustment, estimates a control amount for compensating for the decrease in the edge density based on the detected edge information to adjust a control amount for the clock generation circuit 47. In the semiconductor integrated circuit 1, adaptive control for the DFE circuit 3 is performed after adjustment of the CTLE circuit 2 to enable adaptive control for equalization and a locking operation of the CDR circuit 4 to be performed in a short period.

The CTLE circuit 2 is electrically connected between the receiver node 200a (FIG. 1) and the DFE circuit 3. The CTLE circuit 2 receives the data signal φRX received in the receiver node 200a and boosts the data signal φRX with the boost amount set by the CTLE adjustment circuit 52. The CTLE circuit 2 includes an amplifier 21 the boost amount of which is variable. As for the amplifier 21, an input node thereof is connected to the receiver node 200a, a control node thereof is connected to the CTLE adjustment circuit 52, and an output node thereof is connected to the DFE circuit 3. The amplifier 21 receives the data signal φRX, boosts the data signal φRX, and outputs the data signal φBS. The CTLE circuit 2 supplies the boosted data signal φBS to the DFE circuit 3.

The DFE circuit 3 is electrically connected between the CTLE circuit 2 and the sampler 51. The DFE circuit 3 receives the data signal φBS from the CTLE circuit 2. In a state in which correction control of the DFE adjustment circuit 53 stops, the DFE circuit 3 functions as a buffer and transfers the data signal φBS. In a state in which the DFE adjustment circuit 53 is performing the correction control, the DFE circuit 3 corrects the data signal φBS with the correction amount from the DFE adjustment circuit 53. The DFE circuit 3 includes a sum circuit 31. As for the sum circuit 31, an input node thereof is connected to the CTLE circuit 2, a control node thereof is connected to the DFE adjustment circuit 53, and an output node thereof is connected to the sampler 51. A loop "sum circuit 31→sampler 51→DFE adjustment circuit 53→sum circuit 31" constitutes a loop for a correction operation (DFE operation). In a state in which correction control of the DFE adjustment circuit 53 stops, the sum circuit 31 amplifies the input data signal φBS, for example, by a factor of one, and outputs a data signal φCS. In a state in which the DFE adjustment circuit 53 is performing the correction control, the sum circuit 31 corrects the input data signal φBS with the correction amount from the DFE adjustment circuit 53 and outputs the data signal φCS. The DFE circuit 3 supplies the data signal φCS to the sampler 51.

The sampler 51 is electrically connected to the DFE circuit 3, the CDR circuit 4, and the DFE adjustment circuit 53. The sampler 51 is a data sampler, for example, and can be a flip-flop. As for the sampler 51, a first input node (data input node) thereof is connected to the DFE circuit 3, a second input node (clock node) thereof is connected to the CDR circuit 4, and an output node thereof is connected to the CDR circuit 4, the DFE adjustment circuit 53, and the SIPO circuit 54. The sampler 51 samples the data signal φCS in synchronization with the clock CLK from the CDR circuit 4 and determines which the logical value of the data signal φCS is, 0 or 1. The sampler 51 outputs the data signal φD obtained as a determination result to the CDR circuit 4, the DFE adjustment circuit 53, and the SIPO circuit 54, respectively.

The SIPO circuit 54 is electrically connected between the sampler 51 and the internal circuit 203 (refer to FIG. 1). The SIPO circuit 54 is a SIPO-type shift register, for example, and includes plural-stage registers. The SIPO circuit 54 shifts the data signal φD by one stage at a time in synchronization with the clock CLK and outputs the data signals φD from the registers at the respective stages in parallel to parallelize the data signal φD serving as a serial signal, and the SIPO circuit 54 outputs the data signals φD to the internal circuit 203.

The CTLE adjustment circuit 52 is electrically connected between the CTLE circuit 2 and the identification circuit 45. As for the CTLE adjustment circuit 52, an input node thereof is connected to the identification circuit 45, and an output node thereof is connected to the CTLE circuit 2. A loop "CTLE adjustment circuit 52→CTLE circuit 2→DFE circuit 3→sampler 51→edge detection circuit 41→SIPO circuit 42→identification circuit 45→CTLE adjustment circuit 52" constitutes a feedback loop for adaptive control for the CTLE circuit 2. The CTLE adjustment circuit 52 adjusts the boost amount of the CTLE circuit 2 in an initial operation thereof. The CTLE adjustment circuit 52 ends adjustment of the boost amount based on detection of an identification pattern in the identification circuit 45 and detection frequency of the identification pattern.

The DFE adjustment circuit 53 is electrically connected to the DFE circuit 3, the CDR circuit 4, the sampler 51, and the identification circuit 45. As for the DFE adjustment circuit 53, a first input node (feedback node) thereof is connected to the output node of the sampler 51, a second input node thereof is connected to the identification circuit 45, a third input node (clock node) thereof is connected to the CDR circuit 4, and an output node thereof is connected to the DFE circuit 3. A loop "DFE adjustment circuit 53→DFE circuit 3→sampler 51→edge detection circuit 41→SIPO circuit 42→identification circuit 45→DFE adjustment circuit 53" constitutes a feedback loop for adaptive control for the DFE circuit 3. The DFE adjustment circuit 53 adjusts the correction amount of the DFE circuit 3 in an initial operation thereof. The DFE adjustment circuit 53 starts adjustment of the correction amount based on detection of an identification pattern in the identification circuit 45 and detection frequency of the identification pattern. For example, the DFE adjustment circuit 53 adjusts a tap coefficient indicating the rate of the correction amount to a data signal. The DFE adjustment circuit 53 ends adjustment of the correction amount based on second detection of the identification pattern in the identification circuit 45 and detection frequency of the identification pattern. Also, the DFE adjustment circuit 53 performs correction control itself as well as the operation for adjusting the correction amount (DFE adaptive control). That is, the DFE adjustment circuit 53 generates the correction amount based on the data signal φD fed back from the sampler 51 and the adjusted tap coefficient. The DFE adjustment circuit 53 supplies the correction amount to the DFE circuit 3.

The edge detection circuit 41 is electrically connected between the sampler 51 and the SIPO circuit 42. As for the edge detection circuit 41, a first input node thereof is connected to the sampler 51, a second input node (clock node) thereof is connected to the clock generation circuit 47, and an output node thereof is connected to the SIPO circuit 42. The edge detection circuit 41 detects edges in the data signal φD based on the clock CLK from the clock generation circuit 47 and supplies an edge detection result to the SIPO circuit 42.

The SIPO circuit (holding circuit) 42 is electrically connected between the edge detection circuit 41, and the extraction circuits 43 and 44 and the identification circuit 45. As for the SIPO circuit 42, a first input node thereof is connected to the edge detection circuit 41, a second input node (clock node) thereof is connected to the clock generation circuit 47, and an output node thereof is connected to the extraction circuits 43 and 44, and the identification circuit 45. The SIPO circuit 42 parallelizes the serial edge detection result obtained from the edge detection circuit 41 based on the clock CLK obtained from the clock generation circuit 47 and supplies the edge detection results to the extraction circuits 43 and 44, and the identification circuit 45 based on the clock CLK.

Figure 5:
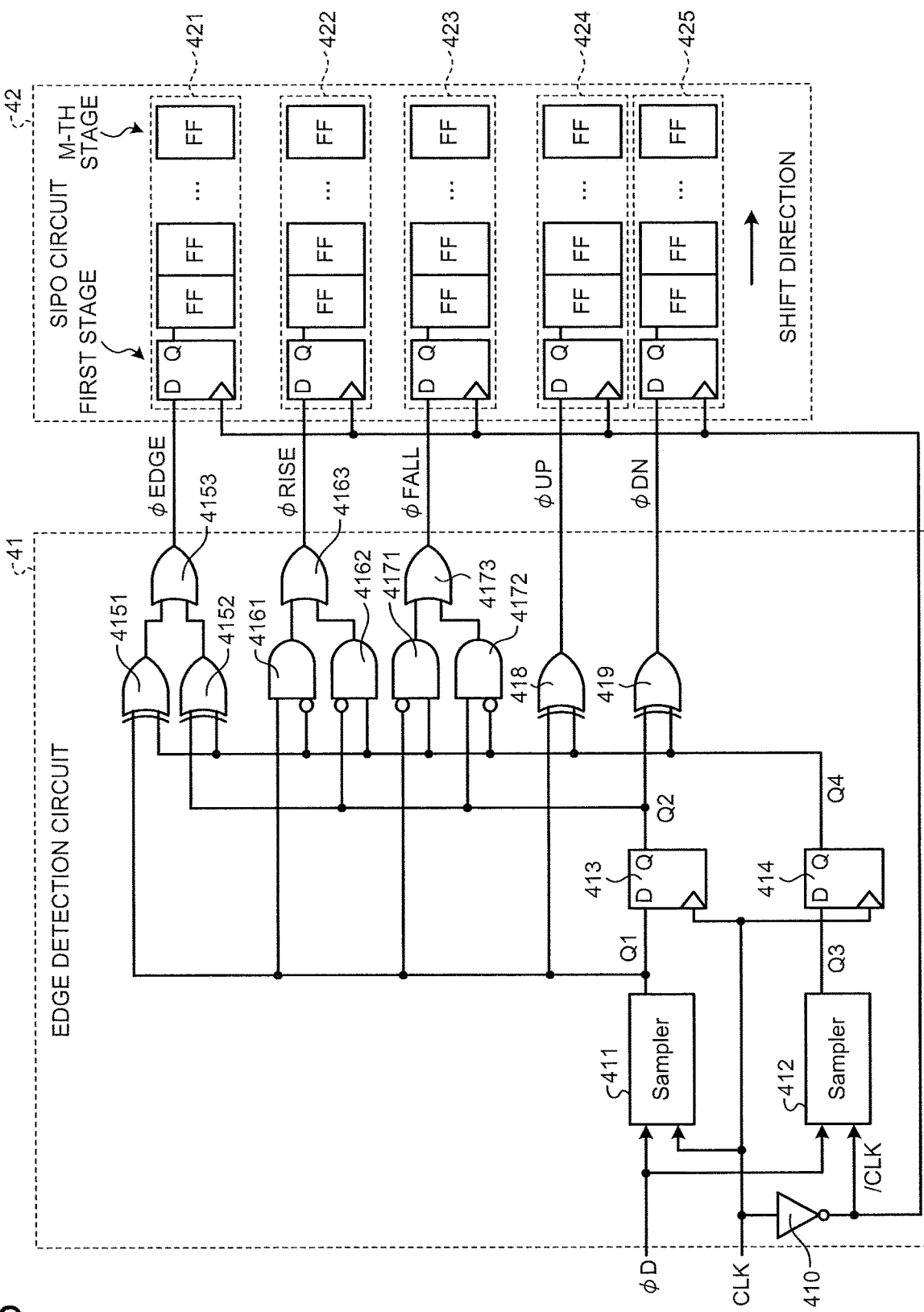
FIG. 5 is a circuit diagram illustrating configurations of an edge detection circuit and a serial input parallel output (SIPO) circuit in the embodiment.

For example, the edge detection circuit 41 and the SIPO circuit 42 can be configured as illustrated in FIG. 5. FIG. 5 is a circuit diagram illustrating configurations of the edge detection circuit 41 and the SIPO circuit 42.

The edge detection circuit 41 extracts edge information in the data signal φD based on sampling results of samplers 411 and 412. The edge detection circuit 41 processes presence/absence, a direction, and phase information of an edge based on a state of a value (logical value) in the data signal φD at the time. Each value (logical value) processed in the edge detection circuit 41 is parallelized in the shift registers in the SIPO circuit 42. The edge detection circuit 41 includes an inverter 410, the samplers 411 and 412, flip-flops 413 and 414, and logical gates 4151 to 4153, 4161 to 4163, 4171 to 4173, 418, and 419. The SIPO circuit 42 includes an EDGE register 421, a RISE register 422, a FALL register 423, an UP register 424, and a DN register 425.

As for the inverter 410, an input node thereof is connected to the CDR circuit 4 (refer to FIG. 4), and an output node thereof is connected to the sampler 412 and the plurality of registers 421 to 425 in the SIPO circuit 42. The inverter 410 logically inverts the clock CLK to generate an inverted clock/CLK and supplies the inverted clock/CLK to the sampler 412, the EDGE register 421, the RISE register 422, the FALL register 423, the UP register 424, and the DN register 425, respectively.

The sampler 411 is a flip-flop, for example, and as for the sampler 411, a first input node (data input node) thereof is connected to the sampler 51 (refer to FIG. 4), a second input node (clock node) thereof is connected to the clock generation circuit 47 (refer to FIG. 4), and an output node thereof is connected to the logical gates 4151, 4161, 4171, and 418, and the flip-flop 413. The sampler 411 samples the data signal ϕD in synchronization with the clock CLK and supplies a sampling result Q1 to the logical gates 4151, 4161, 4171, and 418, and the flip-flop 413, respectively.

The sampler 412 is a flip-flop, for example, and as for the sampler 412, a first input node (data input node) thereof is connected to the sampler 51 (refer to FIG. 4), a second input node (clock node) thereof is connected to the inverter 410, and an output node thereof is connected to the flip-flop 414. The sampler 412 samples the data signal ϕD in synchronization with the inverted clock/CLK and supplies a sampling result Q3 to the flip-flop 414.

As for the flip-flop 413, a first input node (data input node) thereof is connected to the sampler 411, a second input node (clock node) thereof is connected to the clock generation circuit 47 (refer to FIG. 4), and an output node thereof is connected to the logical gates 4152, 4162, 4172, and 419. The flip-flop 413 holds the sampling result Q1 received from the sampler 411 in synchronization with the clock CLK and transfers the held sampling result as a sampling result Q2 to the logical gates 4152, 4162, 4172, and 419, respectively, in synchronization with the clock CLK. The sampling result Q2 is a signal delayed by one cycle of the clock CLK further than the sampling result Q1.

As for the flip-flop 414, a first input node (data input node) thereof is connected to the sampler 412, a second input node (clock node) thereof is connected to the clock generation circuit 47 (refer to FIG. 4), and an output node thereof is connected to the logical gates 4152, 4161, 4162, 4171, 4172, 418, and 419. The flip-flop 413 holds the sampling result Q3 received from the sampler 412 in synchronization with the clock CLK and transfers the held sampling result as a sampling result Q4 to the logical gates 4152, 4161, 4162, 4171, 4172, 418, and 419, respectively, in synchronization with the clock CLK. The sampling result Q4 is a signal delayed by half a cycle of the clock CLK further than the sampling result Q3.

As for the logical gate 4151, a first input node thereof is connected to the sampler 411, a second input node thereof is connected to the flip-flop 414, and an output node thereof is connected to the logical gate 4153. The logical gate 4151 is an EXOR gate, for example, performs an exclusive OR of the sampling result Q1 and the sampling result Q4, and supplies an operation result to the logical gate 4153.

As for the logical gate 4152, a first input node thereof is connected to the flip-flop 413, a second input node thereof is connected to the flip-flop 414, and an output node thereof is connected to the logical gate 4153. The logical gate 4152 is an EXOR gate, for example, performs an exclusive OR of the sampling result Q2 and the sampling result Q4, and supplies an operation result to the logical gate 4153.

As for the logical gate 4153, a first input node thereof is connected to the logical gate 4151, a second input node thereof is connected to the logical gate 4152, and an output node thereof is connected to the EDGE register 421. The logical gate 4153 is an OR gate, for example, performs a logical OR of the operation result of the logical gate 4151 and the operation result of the logical gate 4152, and supplies an operation result as an edge detection signal ϕEDGE to the EDGE register 421. When the EXOR operation is expressed as "^", and the OR operation is expressed as "+", "edge detection signal ϕEDGE=Q1^Q4+Q2^Q4" is established.

As for the logical gate 4161, a first input node thereof is connected to the sampler 411, a second input node thereof is connected to the flip-flop 414, and an output node thereof is connected to the logical gate 4163. The logical gate 4161 is an AND gate having the second input node thereof provided with an inverter, for example, performs a logical AND of the sampling result Q1 and a logical inverse of the sampling result Q4, and supplies an operation result to the logical gate 4163.

As for the logical gate 4162, a first input node thereof is connected to the flip-flop 413, a second input node thereof is connected to the flip-flop 414, and an output node thereof is connected to the logical gate 4163. The logical gate 4162 is an AND gate having the first input node thereof provided with an inverter, for example, performs a logical AND of a logical inverse of the sampling result Q2 and the sampling result Q4, and supplies an operation result to the logical gate 4163.

As for the logical gate 4163, a first input node thereof is connected to the logical gate 4161, a second input node thereof is connected to the logical gate 4162, and an output node thereof is connected to the RISE register 422. The logical gate 4163 is an OR gate, for example, performs a logical OR of the operation result of the logical gate 4161 and the operation result of the logical gate 4162, and supplies an operation result as a rise edge detection signal ϕRISE to the RISE register 422. When the AND operation is expressed as "&", the OR operation is expressed as "+", and the NOT operation is expressed as "/", "rise edge detection signal ϕRISE=Q1&(/Q4)+(/Q2)&Q4" is established.

As for the logical gate 4171, a first input node thereof is connected to the sampler 411, a second input node thereof is connected to the flip-flop 414, and an output node thereof is connected to the logical gate 4173. The logical gate 4171 is an AND gate having the first input node thereof provided with an inverter, for example, performs a logical AND of a logical inverse of the sampling result Q1 and the sampling result Q4, and supplies an operation result to the logical gate 4173.

As for the logical gate 4172, a first input node thereof is connected to the flip-flop 413, a second input node thereof is connected to the flip-flop 414, and an output node thereof is connected to the logical gate 4173. The logical gate 4172 is an AND gate having the second input node thereof provided with an inverter, for example, performs a logical AND of the sampling result Q2 and a logical inverse of the sampling result Q4, and supplies an operation result to the logical gate 4173.

As for the logical gate 4173, a first input node thereof is connected to the logical gate 4171, a second input node thereof is connected to the logical gate 4172, and an output node thereof is connected to the FALL register 423. The logical gate 4173 is an OR gate, for example, performs a logical OR of the operation result of the logical gate 4171 and the operation result of the logical gate 4172, and supplies an operation result as a fall edge detection signal φFALL to the FALL register 423. When the AND operation is expressed as "&", the OR operation is expressed as "+", and the NOT operation is expressed as "/", "fall edge detection signal φFALL=(/Q1)&Q4+Q2&(/Q4)" is established.

As for the logical gate 418, a first input node thereof is connected to the sampler 411, a second input node thereof is connected to the flip-flop 414, and an output node thereof is connected to the UP register 424. The logical gate 418 is an EXOR gate, for example, performs an exclusive OR of the sampling result Q1 and the sampling result Q4, and supplies an operation result as a late signal φLATE (up signal φUP) to the UP register 424. When the EXOR operation is expressed as "^", "late signal φLATE=up signal φP=Q1^Q4" is established.

As for the logical gate 419, a first input node thereof is connected to the flip-flop 413, a second input node thereof is connected to the flip-flop 414, and an output node thereof is connected to the DN register 425. The logical gate 419 is an EXOR gate, for example, performs an exclusive OR of the sampling result Q2 and the sampling result Q4, and supplies an operation result as an early signal φEARLY (down signal φDN) to the DN register 425. When the EXOR operation is expressed as "^", "early signal φEARLY=down signal φDN=Q2^Q4" is established.

The EDGE register 421 is a SIPO-type shift register and includes M-stage (M is an integer higher than N) registers. As for the register at each stage, a data input node thereof is connected to an output node of the previous register, a clock node thereof is connected to the inverter 410, and an output node thereof is connected to a data input node of the subsequent register, the extraction circuit 43, the extraction circuit 44, and the identification circuit 45. A data input node of the first register is connected to the logical gate 415. An output node of the M-th register is connected to the extraction circuits 43 and 44, and the identification circuit 45. In FIG. 5, illustration of the data input nodes, the clock nodes, and the output nodes of the second and subsequent registers is omitted for simplification. The EDGE register 421 shifts (in the right direction in FIG. 5) the edge detection signal φEDGE by one stage at a time to the subsequent stage in synchronization with the inverted clock/CLK and outputs the edge detection signals φEDGE parallelized into M bits to the extraction circuits 43 and 44, and the identification circuit 45.

The RISE register 422 is a SIPO-type shift register and includes M-stage registers. The configuration of the register at each stage is similar to that of the EDGE register 421. The RISE register 422 shifts the rise edge detection signal φRISE by one stage at a time in synchronization with the inverted clock/CLK and outputs the rise edge detection signals φRISE parallelized into M bits to the extraction circuits 43 and 44, and the identification circuit 45.

The FALL register 423 is a SIPO-type shift register and includes M-stage registers. The configuration of the register at each stage is similar to that of the EDGE register 421. The FALL register 423 shifts the fall edge detection signal φFALL by one stage at a time in synchronization with the inverted clock/CLK and outputs the fall edge detection signals φFALL parallelized into M bits to the extraction circuits 43 and 44, and the identification circuit 45.

The UP register 424 is a SIPO-type shift register and includes M-stage registers. The configuration of the register at each stage is similar to that of the EDGE register 421. The UP register 424 shifts the up signal φUP by one stage at a time in synchronization with the inverted clock/CLK and outputs the up signals φUP parallelized into M bits to the extraction circuits 43 and 44, and the identification circuit 45.

The DN register 425 is a SIPO-type shift register and includes M-stage registers. The configuration of the register at each stage is similar to that of the EDGE register 421. The DN register 425 shifts the down signal φDN by one stage at a time in synchronization with the inverted clock/CLK and outputs the down signals ON parallelized into M bits to the extraction circuits 43 and 44, and the identification circuit 45.

Here, an example of operations of the edge detection circuit 41 and the SIPO circuit 42 will be described with reference to FIGS. 6A to 6D and 7A to 7D.

Figure 6A:
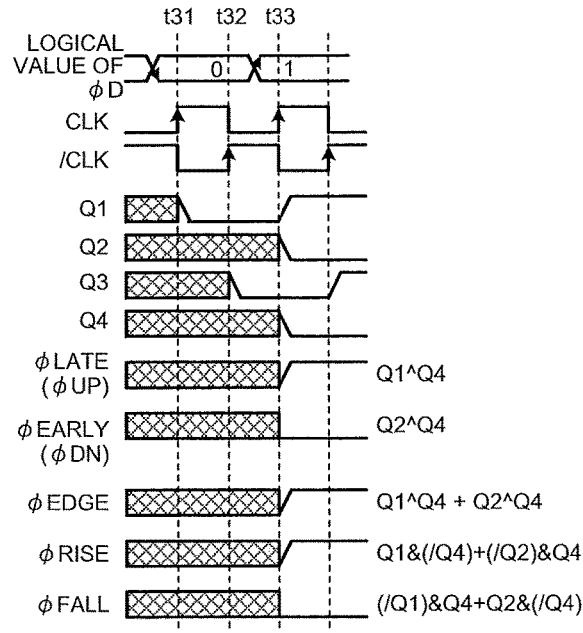
FIGS. 6A to 6D are waveform charts each illustrating operations of the edge detection circuit and the SIPO circuit in the embodiment.
Figure 6B:
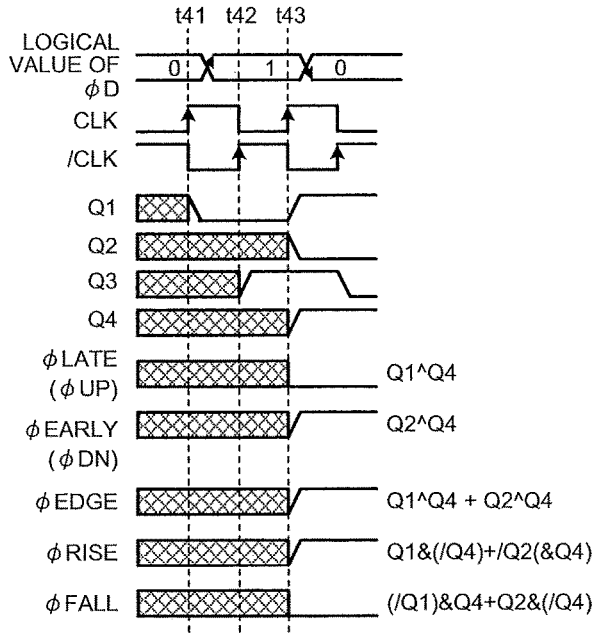

For example, information about the rise edge is detected as illustrated in FIG. 6A or 6B. Each of FIGS. 6A and 6B is a waveform chart illustrating operations of the edge detection circuit 41 and the SIPO circuit 42 at the time of detection of the rise edge. At the rise edge of the data signal φD, the logical value of the data signal φD changes from 0 to 1, and the potential level thereof zero-crosses from the − side to the + side. In the waveform of the data signal φD illustrated in FIG. 7A, the potential level zero-crosses from the − side to the + side at the rise edge at a time between the timings t11 and t12 and the rise edge at a time between the timings t16 and t17. FIG. 7A illustrates the waveform of the data signal φD.

At a timing t31 illustrated in FIG. 6A, along with rise of the clock CLK, the sampler 411 samples the logical value "0" (L level) of the data signal φD, and the sampling result Q1 is in the L level.

At a timing t32 illustrated in FIG. 6A, along with rise of the inverted clock/CLK, the sampler 412 samples the logical value "0" (L level) of the data signal φD, and the sampling result Q3 is in the L level.

At a timing t33 illustrated in FIG. 6A, along with rise of the clock CLK, the sampler 411 samples the logical value "1" (H level) of the data signal φD, and the sampling result Q1 shifts from the L level to the H level. Also, along with "sampling results (Q2,Q4,Q1)=(L level, L level, H level)", each of the edge detection signal φEDGE and the rise edge detection signal φRISE shifts from the L level to the H level, and the up signal φUP shifts from the L level to the H level.

That is, in FIG. 6A, operations are performed at the timing t33 as a starting point, taking the levels of the data signal φD at the timings t31, t32, and t33 as the sampling results Q2, Q4, and Q1. That is, based on "sampling results (Q2,Q4, Q1)=(L level, L level, H level)", the rise edge of the data signal φD is detected. Based on "sampling results (Q4,Q1)=(L level, H level)", it is detected that the phase of the clock CLK lags behind the data signal φD (LATE state), and the late signal LATE shifts from the L level to the H level. That is, since the phase of the clock CLK is required to lead (go UP), the up signal φUP shifts from the L level to the H level.

At a timing t41 illustrated in FIG. 6B, along with rise of the clock CLK, the sampler 411 samples the logical value "0" (L level) of the data signal φD, and the sampling result Q1 is in the L level.

At a timing t42 illustrated in FIG. 6B, along with rise of the inverted clock/CLK, the sampler 412 samples the logical value "1" (H level) of the data signal φD, and the sampling result Q3 is in the H level.

At a timing t43 illustrated in FIG. 6B, along with rise of the clock CLK, the sampler 411 samples the logical value "1" (H level) of the data signal φD, and the sampling result Q1 shifts from the L level to the H level. Also, along with "sampling results (Q2,Q4,Q1)=(L level, H level, H level)", each of the edge detection signal φEDGE and the rise edge detection signal φRISE shifts from the L level to the H level, and the down signal φDN shifts from the L level to the H level.

That is, in FIG. 6B, operations are performed at the timing t43 as a starting point, taking the levels of the data signal φD at the timings t41, t42, and t43 as the sampling results Q2, Q4, and Q1. That is, based on "sampling results (Q2,Q4,Q1)=(L level, H level, H level)", the rise edge of the data signal φD is detected. Based on "sampling results (Q2,Q4) (L level, H level)", it is detected that the phase of the clock CLK leads ahead of the data signal φD (EARLY state), and the early signal φEARLY shifts from the L level to the H level. That is, since the phase of the clock CLK is required to lag (go DOWN (DN)), the down signal φDN shifts from the L level to the H level.

Figure 7B:
Figure 7C:
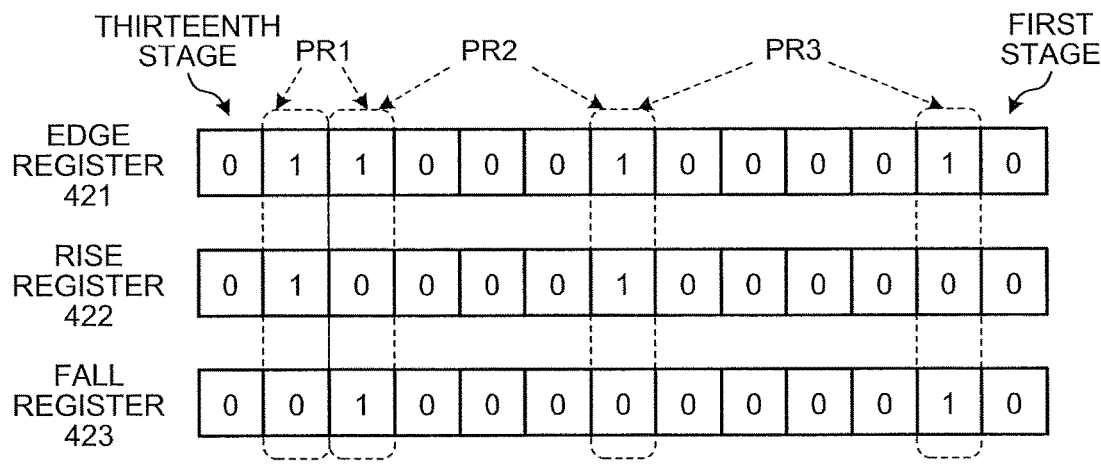
Figure 7D:
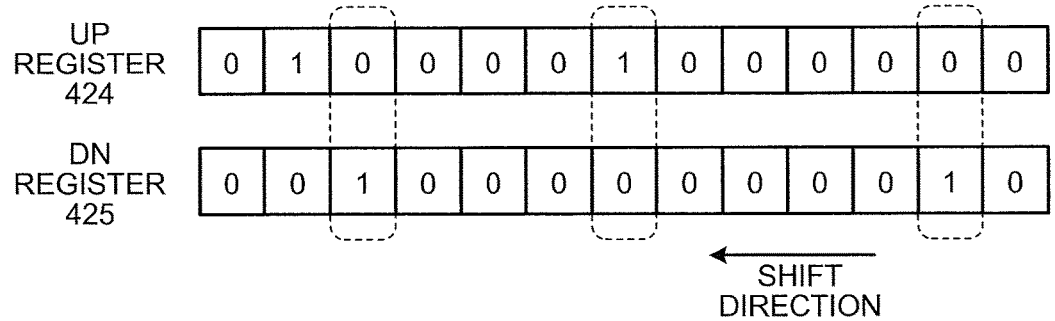

For example, the two rise edges illustrated in FIG. 7A exist close to target timings t12 and t17 as illustrated in FIG. 7B. This is figured out from the twelfth and seventh registers holding bit values "(EDGE register 421, RISE register 422, FALL register 423)=(1,1,0)" as illustrated in FIG. 7C. The twelfth and seventh registers in each of the EDGE register 421, the RISE register 422, and the FALL register 423 correspond to the timings t12 and t17. As illustrated in FIG. 7A, since the phase of the clock CLK lags behind the data signal φD at the rise edges around the timings t12 and t17 in the waveform of the data signal φD, the edge detection circuit 41 outputs the up signal φUP giving instruction in making the phase of the clock CLK lead as illustrated in FIG. 7D.

FIG. 7B illustrates edge information detected in the edge detection circuit 41, and in the figure, "∀" represents a rise edge while "1" represents a fall edge. FIG. 7C illustrates bit values stored in the registers at the respective stages of the EDGE register 421, the RISE register 422, and the FALL register 423, and the register at each stage stores 0 when the signal is in the L level and stores 1 when the signal is in the H level. FIG. 7D illustrates bit values stored in the registers at the respective stages of the UP register 424 and the DN register 425, and the register at each stage stores 0 when the signal is in the L level and stores 1 when the signal is in the H level. In FIGS. 7C and 7D, the registers at the respective stages are illustrated in an opposite direction to those in FIG. 5, the first register is illustrated on the right side, the Mth (M=13 in FIG. 7A) register is illustrated on the left side, and the direction of the shift operation is from the right side to the left side of the figure. In the configuration illustrated in FIGS. 7C and 7D, the thirteen register is a register holding the oldest data, and the first register is a register holding the newest data. In other words, in the configuration illustrated in FIGS. 7C and 7D, the register located further on the left side holds older data, and the register located further on the right side holds newer data.

Figure 6C:
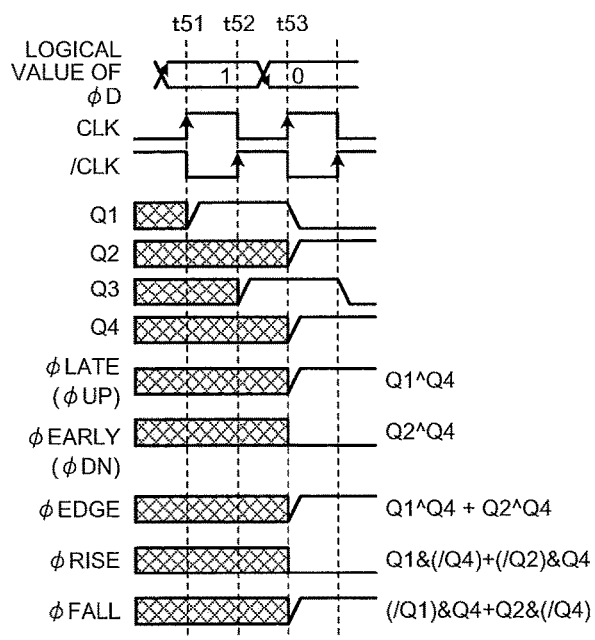
Figure 6D:
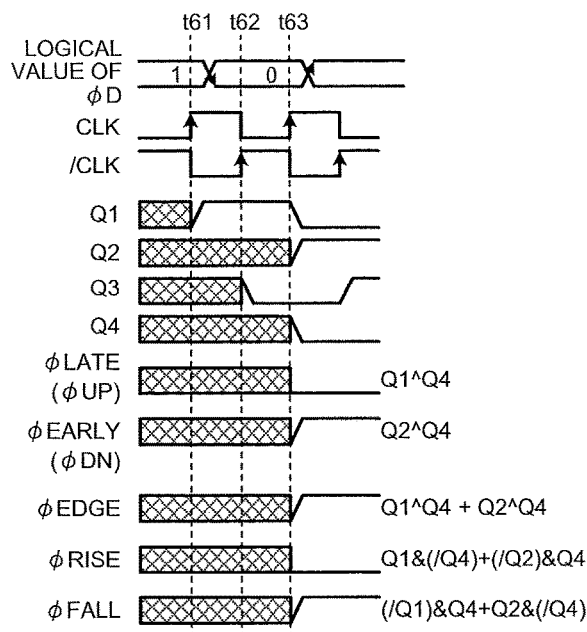

Also, information about the fall edge is detected as illustrated in FIG. 6C or 6D. Each of FIGS. 6C and 6D is a waveform chart illustrating operations of the edge detection circuit 41 and the SIPO circuit 42 at the time of detection of the fall edge. At the fall edge of the data signal φD, the logical value of the data signal φD changes from 1 to 0, and the potential level thereof zero-crosses from the + side to the − side. In the waveform of the data signal φD illustrated in FIG. 7A, the potential level zero-crosses from the + side to the − side at the fall edge at a time between the timings t13 and t14 and the fall edge at a time between the timings t22 and t23.

At a timing t51 illustrated in FIG. 6C, along with rise of the clock CLK, the sampler 411 samples the logical value "1" (H level) of the data signal φD, and the sampling result Q1 is in the H level.

At a timing t52 illustrated in FIG. 6C, along with rise of the inverted clock/CLK, the sampler 412 samples the logical value "1" (H level) of the data signal φD, and the sampling result Q3 is in the H level.

At a timing t53 illustrated in FIG. 6C, along with rise of the clock CLK, the sampler 411 samples the logical value "0" (L level) of the data signal φD, and the sampling result Q1 shifts from the H level to the L level. Also, along with "sampling results (Q2,Q4,Q1)=(H level, H level, L level)", each of the edge detection signal φEDGE and the fall edge detection signal φFALL shifts from the L level to the H level, and the up signal φUP shifts from the L level to the H level.

That is, in FIG. 6C, operations are performed at the timing t53 as a starting point, taking the levels of the data signal φD at the timings t51, t52, and t53 as the sampling results Q2, Q4, and Q1. That is, based on "sampling results (Q2,Q4,Q1)=(H level, H level, L level)", the fall edge of the data signal φD is detected. Based on "sampling results (Q4,Q1)=(H level, L level)", it is detected that the phase of the clock CLK lags behind the data signal φD (LATE state), and the late signal φLATE shifts from the L level to the H level. That is, since the phase of the clock CLK is required to lead (go UP), the up signal φUP shifts from the L level to the H level.

At a timing t61 illustrated in FIG. 6D, along with rise of the clock CLK, the sampler 411 samples the logical value "1" (H level) of the data signal φD, and the sampling result Q1 is in the H level.

At a timing t62 illustrated in FIG. 6D, along with rise of the inverted clock/CLK, the sampler 412 samples the logical value "0" (L level) of the data signal φD, and the sampling result Q3 is in the L level.

At a timing t63 illustrated in FIG. 6D, along with rise of the clock CLK, the sampler 411 samples the logical value "0" (L level) of the data signal φD, and the sampling result Q1 shifts from the H level to the L level. Also, along with "sampling results (Q2,Q4,Q1) (H level, L level, L level)", each of the edge detection signal φEDGE and the fall edge detection signal φFALL shifts from the L level to the H level, and the down signal φDN shifts from the L level to the H level.

That is, in FIG. 6D, operations are performed at the timing t63 as a starting point, taking the levels of the data signal φD at the timings t61, t62, and t63 as the sampling results Q2, Q4, and Q1. That is, based on "sampling results (Q2,Q4,Q1)=(H level, L level, L level)", the fall edge of the data signal φD is detected. Based on "sampling results (Q2,Q4)=(H level, L level)", it is detected that the phase of the clock CLK leads ahead of the data signal φD (EARLY state), and the early signal φEARLY shifts from the L level to the H level. That is, since the phase of the clock CLK is required to lag (go DOWN (DN)), the down signal ϕDN shifts from the L level to the H level.

For example, the two fall edges illustrated in FIG. 7A exist close to target timings t13 and t22. This is figured out from the eleventh and second registers holding bit values "(EDGE register 421, RISE register 422, FALL register 423)=(1,0,1)" as illustrated in FIG. 7C. The eleventh and second registers in each of the EDGE register 421, the RISE register 422, and the FALL register 423 correspond to the timings t13 and t22. As illustrated in FIG. 7A, since the phase of the clock CLK leads ahead of the data signal ϕD at the fall edges around the timings t13 and t22 in the waveform of the data signal ϕD, the edge detection circuit 41 outputs the down signal ϕDN giving instruction in making the phase of the clock CLK lag as illustrated in FIG. 7D.

The extraction circuit 44 illustrated in FIG. 4 is electrically connected between the SIPO circuit 42 and the control circuit 46. As for the extraction circuit 44, an input node thereof is connected to the SIPO circuit 42, and an output node thereof is connected to the control circuit 46. The extraction circuit 44 extracts from the waveform of the data signal ϕD information about a pair consisting of a rise edge and a fall edge which are temporarily separated from each other N or more times as much as a clock cycle based on the edge detection result held in the SIPO circuit 42. That is, the extraction circuit 44 refers to bit values held in the EDGE register 421, the RISE register 422, and the FALL register 423, and based on the reference result, extracts information of a pair consisting of a rise edge and a fall edge which are temporarily separated from each other N or more times as much as a clock cycle.

For example, in the case of FIG. 7C, based on the twelfth and seventh registers holding bit values "(EDGE register 421, RISE register 422, FALL register 423)=(1,1,0), the extraction circuit 44 figures out that rise edges are detected close to the timings t12 and t17 illustrated in FIG. 7A. Also, based on the eleventh and second registers holding bit values "(EDGE register 421, RISE register 422, FALL register 423)=(1,0,1)", the extraction circuit 44 figures out that fall edges are detected close to the timings t13 and t22 illustrated in FIG. 7A.

The extraction circuit 44 specifies detected pairs PR1, PR2, and PR3 of temporarily adjacent edges. The pair PR1 is a pair consisting of the rise edge at the timing t12 and the fall edge at the timing t13. The pair PR2 is a pair consisting of the fall edge at the timing t13 and the rise edge at the timing t17. The pair PR3 is a pair consisting of the rise edge at the timing t17 and the fall edge at the timing t22.

The extraction circuit 44 derives a time interval between the edges of each of the specified pairs PR1, PR2, and PR3. The extraction circuit 44 finds out that the period between the rise edge and the fall edge in the pair PR1 is one UI. The extraction circuit 44 finds out that the period between the fall edge and the rise edge in the pair PR2 is four UIs. The extraction circuit 44 finds out that the period between the rise edge and the fall edge in the pair PR3 is five UIs. For example, in a case in which N=4, and in which a pair consisting of a rise edge and a fall edge which are temporarily separated from each other four or more times (that is, by four or more UIs) as much as a clock cycle is to be extracted, the extraction circuit 44 excludes the pair PR1 and extracts the pairs PR2 and PR3 as pairs each containing a low-frequency component, which are to be used for phase adjustment.

Based on the extracted result, the extraction circuit 44 selects as phase information (lag/lead) the bit values in the eleventh, seventh, and second registers of the DN register 424 and the UP register 425 and supplies the phase information to the control circuit 46.

The extraction circuit 43 illustrated in FIG. 4 is electrically connected between the SIPO circuit 42 and the control circuit 46. As for the extraction circuit 43, an input node thereof is connected to the SIPO circuit 42, and an output node thereof is connected to the control circuit 46. The extraction circuit 43 extracts information about all of the edges from the waveform of the data signal ϕD based on the edge detection result held in the SIPO circuit 42. For example, the extraction circuit 43 refers to the EDGE register 421 and extracts information about all of the edges based on the reference result.

Based on the extracted result, the extraction circuit 43 selects as phase information (lag/lead) the bit values in the twelfth, eleventh, seventh, and second registers of the DN register 424 and the UP register 425 and supplies the phase information to the control circuit 46.

The identification circuit 45 is electrically connected between the SIPO circuit 42, and the control circuit 46, the CTLE adjustment circuit 52, and the DFE adjustment circuit 53. As for the identification circuit 45, an input node thereof is connected to the SIPO circuit 42, and an output node thereof is connected to the control circuit 46, the CTLE adjustment circuit 52, and the DFE adjustment circuit 53. The identification circuit 45 receives the data signal ϕD from the sampler 51 via the edge detection circuit 41 and the SIPO circuit 42 and searches and detects an identification pattern contained in the data signal ϕD.

For example, in a case in which the data signal is subjected to 64*b*/66*b* encoding, the identification circuit 45 may detect as an identification pattern a two-bit preamble (the preamble is also called a Sync header or a Sync bit) every 66 bits. The preamble indicates information about a payload. For example, "10" indicates that the payload is normal data while "01" indicates that the payload is control data. In the payload, clock information overlaps with data in a scrambling method.

Alternatively, in a case in which the data signal is subjected to 128*b*/130*b* encoding, the identification circuit 45 may detect as an identification pattern a two-bit preamble every 130 bits.

Alternatively, the identification pattern is not limited to the preamble (or the Sync header or the Sync bit) but may be a specific pattern. For example, in a case in which the data signal conforms to the PCIe standard, the identification circuit 45 may detect as an identification pattern a bit pattern of a TS1 symbol serving as a special symbol for synchronization specified in the PCIe standard.

That is, the identification circuit 45 searches an identification pattern contained in the data signal ϕD. When the identification circuit 45 detects an identification pattern, the identification circuit 45 notifies the control circuit 46, the CTLE adjustment circuit 52, and the DFE adjustment circuit 53 that the identification pattern has been detected.

Meanwhile, in consideration of control stability, the identification circuit 45 may not notify the control circuit 46, the CTLE adjustment circuit 52, and the DFE adjustment circuit 53 that the identification pattern has been detected in a case in which the consecutive number of times of detection of the identification pattern is less than m (m is an arbitrary integer of two or higher) and may notify the control circuit 46, the CTLE adjustment circuit 52, and the DFE adjustment circuit 53 that the identification pattern has been detected in a case in which the consecutive number of times of detection of the identification pattern is m or higher.

Alternatively, in consideration of control stability and accuracy, the identification circuit 45 may calculate an estimated bit error rate based on information about detection and loss of the identification pattern. In a case in which a block contains K bits (K is an arbitrary integer of two or higher), and in which an error generation rate in each bit is random, the number of combinations of error presence/absence in all of the bits is 2K. It can be considered that at least two bits in the preamble (or the Sync header or the Sync bit) changes from "01" or "10" to "00" or "11" due to error generation when the error occurs in either one of the bits. That is, it can be considered that the number of the combinations when the error occurs in the two bits is two, "true-false" and "false-true", out of "true-true", "true-false", "false-true", and "false-false" combinations. Therefore, the rate at which the error occurs in the two bits in the preamble among all of the combinations is $2^K/(2^K/2)=\frac{1}{2}$. Also, since error generation in each bit is regarded as being random, it can be estimated that the same error rate is applied to arbitrary consecutive two bits in a block containing (K−1) bits, and it can thus be estimated that the number of errors in the block is K/2 times higher than the error rate of the preamble. Consequently, in a case in which the number of errors in a preamble in a predetermined period is figured out, the entire error rate can be estimated.

For example, the estimated bit error rate can be calculated by Equation 1 illustrated below.

(estimated bit error rate)=(number of times of loss)/{(data rate)×(determination period)}×(block bit number)/2     Equation 1

The data rate, the determination period, and the block bit number can be set in the identification circuit 45 in advance. The identification circuit 45 searches the identification pattern on the data signal φD containing as many bits as the set block bit number and counts the number of times of loss of the identification pattern. The identification circuit 45 may calculate the estimated bit error rate with use of Equation 1 in accordance with the counted number of times of loss. For example, in a case in which the data rate is 32 Gbps, in which the determination period is 50 μsec, and in which the block bit number contained in the data signal φD is 130, and in a case in which the identification circuit 45 finds that the number of times of loss of the identification pattern (the number of times of failure in detection) is ten, the identification circuit 45 derives $4.06 \times 10^{-4}$ as the estimated bit error rate.

The identification circuit 45 may not notify the control circuit 46, the CTLE adjustment circuit 52, and the DFE adjustment circuit 53 that the identification pattern has been detected in a case in which the estimated bit error rate is a threshold value or higher and may notify the control circuit 46, the CTLE adjustment circuit 52, and the DFE adjustment circuit 53 that the identification pattern has been detected in a case in which the estimated bit error rate is less than the threshold value.

The control circuit 46 is electrically connected between the extraction circuits 43 and 44 and the identification circuit 45, and the clock generation circuit 47. As for the control circuit 46, an input node thereof is connected to the extraction circuits 43 and 44 and the identification circuit 45, and an output node thereof is connected to the clock generation circuit 47. In an initial operation, the control circuit 46 employs phase information (lag/lead) about a pair consisting of a rise edge and a fall edge which are temporarily separated from each other N or more times as much as a clock cycle. The rise edge and the fall edge which are temporarily separated from each other N or more times as much as the clock cycle can be paraphrased into both the edges each having a low-frequency pulse which is 1 or 0. When an identification pattern is detected in the identification circuit 45, the control circuit 46 recognizes end of the initial operation and employs phase information (lag/lead) about all of the edges supplied from the extraction circuit 43.

The control circuit 46 integrates the phase information (lag/lead) about the paired edges for a predetermined period to do phase adjustment of the CDR circuit 4. The control circuit 46 determines a phase adjustment direction of the clock generation circuit 47 based on the magnitude of ΣDN and ΣUP obtained by accumulating the bit value of the DN register 424 and the bit value of the UP register 425 for the target paired edges for a predetermined period (for example, a longer period than N times the clock cycle). The control circuit 46 determines a control amount for phase adjustment based on the determined phase adjustment direction. At this time, the control circuit 46 increases a control amount derived with use of the pair consisting of the rise edge and the fall edge N times and uses the increased amount as a control amount for the phase adjustment.

For example, in a case in which a control amount is derived with use of the rise edge and the fall edge of the pair PR2 illustrated in FIG. 7C, the time interval between the rise edge and the fall edge is four UIs, and the control circuit 46 thus multiplies the control amount by four and uses the multiplied amount as a control amount for the phase adjustment. In a case in which a control amount is derived with use of the rise edge and the fall edge of the pair PR3, the time interval between the rise edge and the fall edge is five UIs, and the control circuit 46 thus multiplies the control amount by five and uses the multiplied amount as a control amount for the phase adjustment.

The clock generation circuit 47 illustrated in FIG. 4 is electrically connected between the control circuit 46, and the sampler 51, the DFE adjustment circuit 53, the edge detection circuit 41, and the SIPO circuit 42. As for the clock generation circuit 47, an input node thereof is connected to the control circuit 46, and an output node thereof is connected to the sampler 51, the DFE adjustment circuit 53, the edge detection circuit 41, and the SIPO circuit 42. The clock generation circuit 47 generates a clock CLK the phase of which is adjusted based on the control amount supplied from the control circuit 46. The control amount supplied from the control circuit 46 is a control amount of current that is to flow in the CP circuit 471. The CP circuit 471 includes a variable current source 471a and a capacitance element 471b. The variable current source 471a stores charge in the capacitance element based on a current amount corresponding to the control amount from the control circuit 46. Consequently, the CP circuit 471 causes voltage corresponding to the control amount from the control circuit 46 to be generated in the capacitance element and supplies the voltage to the VCO circuit 472. The VCO circuit 472 generates a clock CLK oscillating at a frequency corresponding to the voltage. Consequently, the clock generation circuit 47 generates the clock CLK the phase of which is adjusted based on the control amount supplied from the control circuit 46. The clock generation circuit 47 supplies the clock CLK to the sampler 51, the DFE adjustment circuit 53, the edge detection circuit 41, and the SIPO circuit 42.

Figure 8:
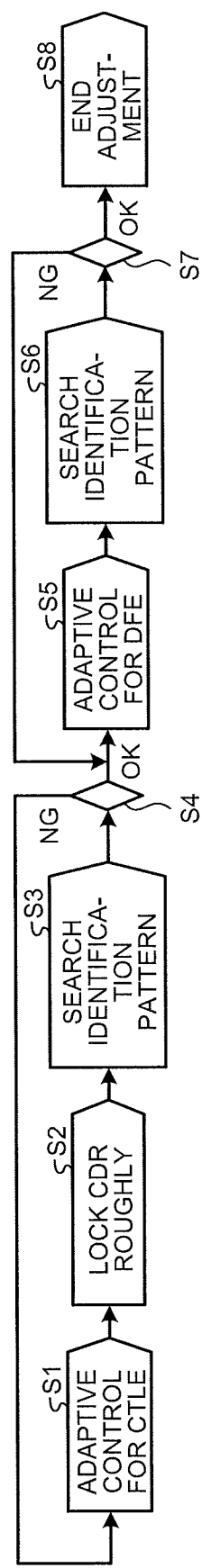
FIG. 8 is a flowchart illustrating an operation of the semiconductor integrated circuit according to the embodiment.
Figure 9:
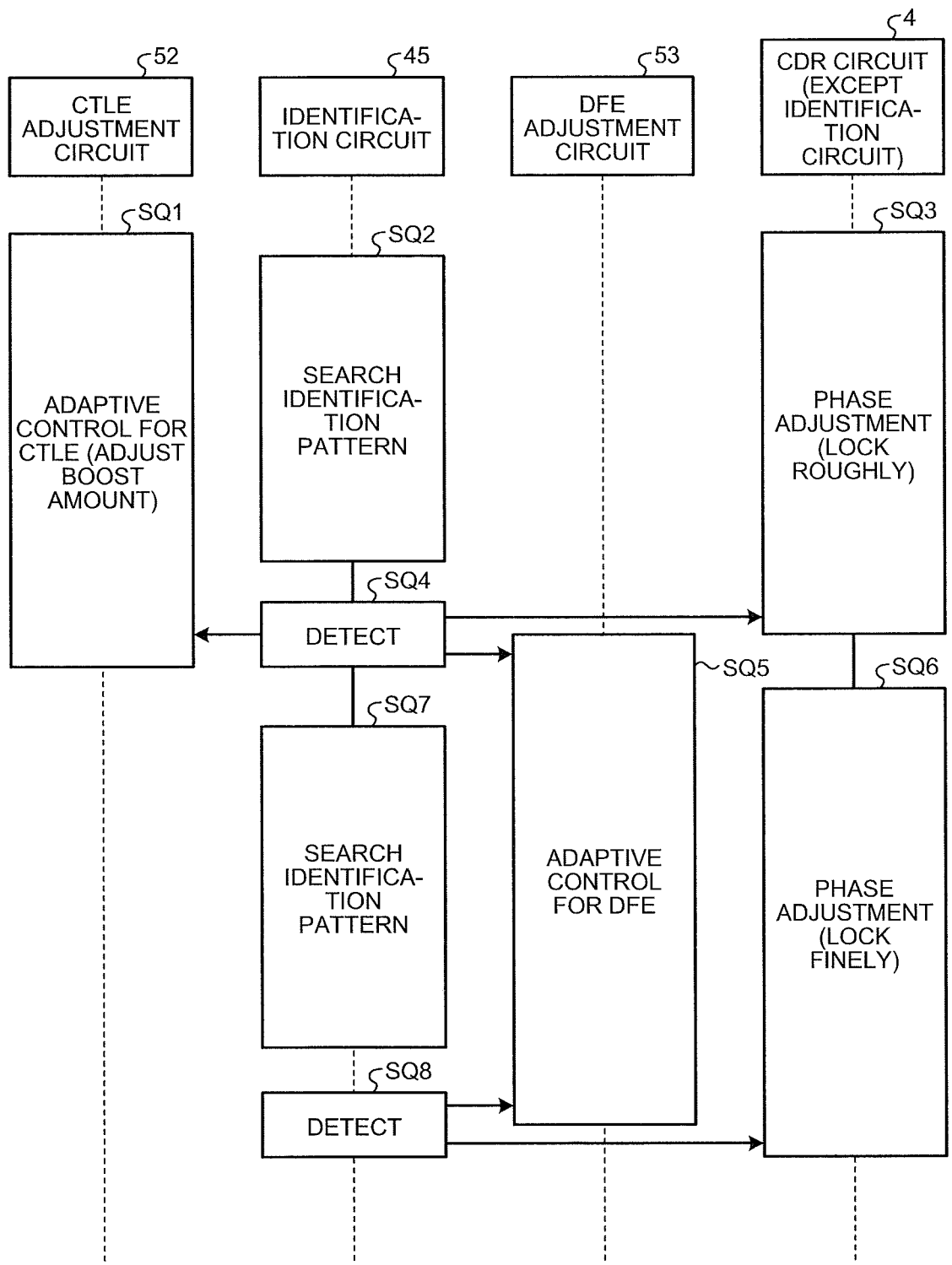
FIG. 9 is a sequence chart illustrating the operation of the semiconductor integrated circuit according to the embodiment.

Next, an operation of the semiconductor integrated circuit 1 will be described with reference to FIGS. 8 and 9. FIG. 8 is a flowchart illustrating the operation of the semiconductor integrated circuit 1. FIG. 9 is a sequence chart illustrating the operation of the semiconductor integrated circuit 1.

When a timing to start the initial operation, such as a timing to activate the receiver device 200, comes, the semiconductor integrated circuit 1 starts adjustment of the boost amount of the CTLE circuit 2 by means of the CTLE adjustment circuit 52. That is, adaptive control for making the boost amount of the CTLE circuit 2 appropriate is performed (S1). At the same time, information about a pair containing a low-frequency component is extracted from the boosted data signal φBS, and phase adjustment for locking the CDR circuit 4 roughly is performed with use of the extracted information (S2). The semiconductor integrated circuit 1 searches the identification pattern by means of the identification circuit 45 (S3) and repeats S1 to S3 until a first condition is satisfied (NG in S4). The first condition may be a condition in which the identification pattern is detected once, a condition in which the consecutive number of times of detection of the identification pattern is m or higher, or a condition in which the estimated bit error rate calculated based on information about detection and loss of the identification pattern is a first threshold value or higher. The first threshold value may be $1 \times 10^{-4}$, for example.

According to the sequence chart in FIG. 9, the adaptive control for the CTLE circuit 2 by means of the CTLE adjustment circuit 52 (SQ1) and the rough phase adjustment in the CDR circuit 4 with use of the pair containing a low-frequency component (SQ3) are started almost at the same time, and the search of the identification pattern by means of the identification circuit 45 (SQ2) is started slightly later than SQ1 and SQ3. Thereafter, SQ1 to SQ3 are executed in parallel.

In FIG. 8, when the first condition is satisfied (OK in S4), the semiconductor integrated circuit 1 recognizes that the CDR circuit 4 has been locked roughly, ends the adaptive control for the CTLE circuit 2, and starts phase adjustment for locking the CDR circuit 4 finely with use of all of the edges in the CDR circuit 4. Also, the semiconductor integrated circuit 1 starts adjustment of the correction amount of the DFE circuit 3. That is, adaptive control for making the correction amount of the DFE circuit 3 appropriate is performed (S5). The semiconductor integrated circuit 1 searches the identification pattern by means of the identification circuit 45 (S6) and repeats S5 to S6 until a second condition is satisfied (NG in S7). The second condition may be a condition in which the identification pattern is detected once, a condition in which the consecutive number of times of detection of the identification pattern is m or higher, or higher than m, or a condition in which the estimated bit error rate calculated based on information about detection and loss of the identification pattern is a second threshold value or higher. The second threshold value may be $1 \times 10^{-12}$, for example.

When the second condition is satisfied (OK in S7), the semiconductor integrated circuit 1 recognizes that the CDR circuit 4 has been locked finely and ends the adjustment processing (S8).

According to the sequence chart in FIG. 9, when the identification pattern is detected in the identification circuit 45 (SQ4), SQ1 and SQ3 end, the adaptive control for the DFE circuit 3 by means of the DFE adjustment circuit 53 (SQ5) is started, and along with the start of SQ5, phase adjustment in the CDR circuit 4 is switched from the rough adjustment (SQ3) to the fine adjustment (SQ6). The search of the identification pattern by means of the identification circuit 45 (SQ7) is started again slightly later than SQ6. Thereafter, SQ5 to SQ7 are executed in parallel. When the identification pattern is detected in the identification circuit 45 (SQ8), SQ5 and SQ6 end, and the adjustment processing ends.

Meanwhile, although SQ5 ends along with SQ8, SQ6 may be continued afterward.

As described above, in the present embodiment, in the semiconductor integrated circuit 1, the pair containing a low-frequency component is extracted in the CDR circuit 4 from the data signal boosted in the CTLE circuit 2, and the phase adjustment is performed in the CDR circuit 4 with use of the information about the extracted pair. Accordingly, in the initial operation, even in a case in which a sufficient opening of the eye pattern is not obtained in the waveform after processing by the CTLE circuit 2, a locking position of the CDR circuit 4 can be specified roughly, and the CDR circuit 4 can be locked roughly and appropriately. As a result, since locking of the CDR circuit 4 can be optimized, rough adaptive control for making the boost amount of the CTLE circuit 2 appropriate can be performed. Also, thereafter, fine adaptive control for making the correction amount of the DFE circuit 3 appropriate while locking the CDR circuit 4 finely with use of all of the edges can be performed. Hence, stepwise improvement of accuracy of equalization and stepwise improvement of accuracy of phase adjustment for the clock can be performed in parallel, and lock of the CDR circuit 4 can efficiently be made to be appropriate by avoiding erroneous lock.

Figure 10:
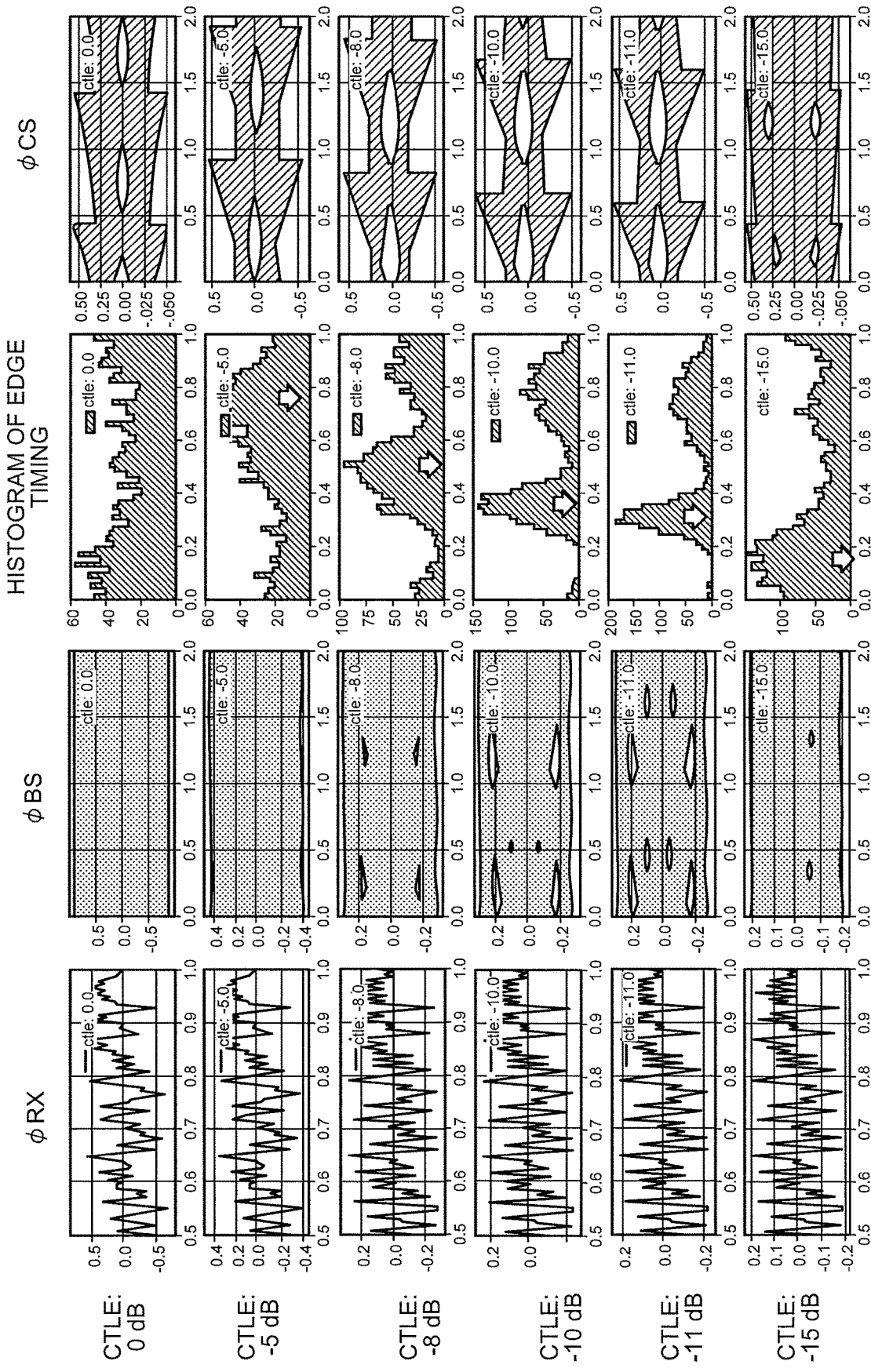
FIG. 10 illustrates the operation of the semiconductor integrated circuit according to the embodiment.

For example, a result of equalization by means of the CTLE circuit 2 and the DFE circuit 3 based on a lock point of the CDR circuit 4 obtained by searching a most frequent position of edges containing a low-frequency component while the boost amount of the CTLE circuit 2 is changed to 0 dB, −5 dB, −8 dB, −10 dB, −11 dB, and −15 dB, is illustrated in FIG. 10. FIG. 10 illustrates a result of the operation of the semiconductor integrated circuit 1. FIG. 10 illustrates a waveform of the received data signal φRX, an eye pattern of the boosted data signal φBS, a histogram of an edge timing detected from the data signal φBS, and an eye pattern of the data signal φCS corrected in the DFE circuit 3 at each of the boost amounts φdB, −5 dB, −8 dB, −10 dB, −11 dB, and −15 dB of the CTLE circuit 2. As illustrated in FIG. 10, a state in which the opening of the eye pattern is made to be appropriate can be obtained after the equalization by means of the CTLE circuit 2 and the DFE circuit 3. For example, it is found that, when the boost amount of the CTLE circuit 2 is −11 dB, the width in the amplitude direction and the width in the time direction of the openings of the eye patterns of the data signals φBS and +CS can be assured most.

Modification Example

Meanwhile, in the configuration illustrated in FIG. 4, information required for locking of the CDR circuit 4 is obtained by setting of the CTLE circuit 2. For this reason, the DFE circuit 3 can be removed from the loop for the phase lock of the clock CLK to separate the feedback loop for the adaptive control for the DFE circuit 3 from the loop for the phase lock of the clock CLK. Accordingly, the phase adjustment of the clock CLK and the adaptive control for the DFE circuit 3 can be performed independently.

Figure 11:
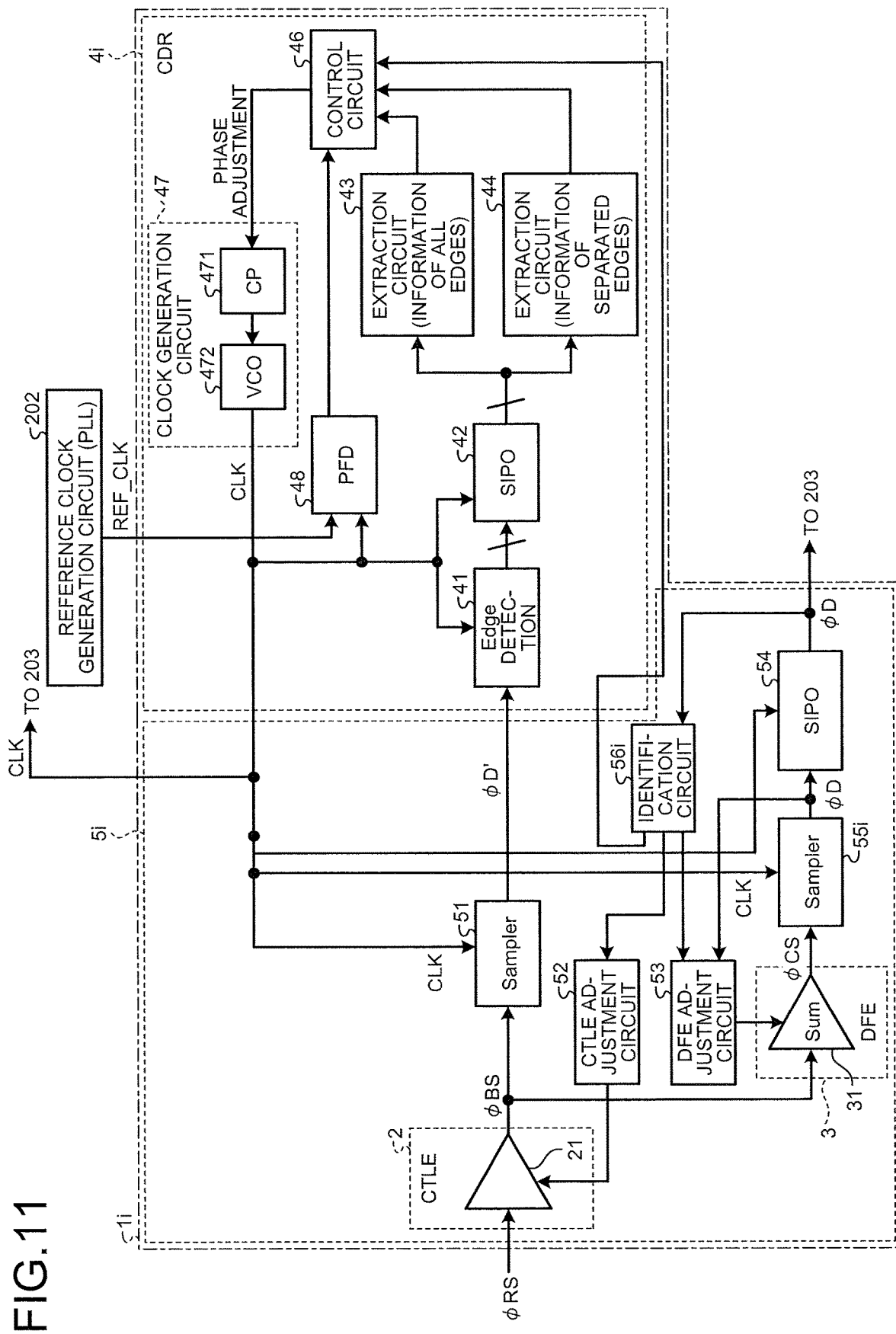
FIG. 11 illustrates a configuration of a semiconductor integrated circuit according to a modification example of the embodiment.

Specifically, a semiconductor integrated circuit 1i can be configured as illustrated in FIG. 11. FIG. 11 illustrates a configuration of the semiconductor integrated circuit 1i according to a modification example of the embodiment. The semiconductor integrated circuit 1i includes a received signal processing circuit 5i and a CDR circuit 4i instead of the received signal processing circuit 5 and the CDR circuit 4 (refer to FIG. 4). The CDR circuit 4i does not include the identification circuit 45, and the received signal processing circuit 5i further includes a sampler 55i and an identification circuit 56i.

In the configuration in FIG. 11, a feedback loop for the adaptive control for the DFE circuit 3 (loop "DFE adjustment circuit 53→DFE circuit 3→sampler 55i→SIPO circuit 54→identification circuit 56i→DFE adjustment circuit 53") is independent from a loop for the phase lock of the clock CLK (control circuit 46→clock generation circuit 47→sampler 51→edge detection circuit 41→SIPO circuit 42→extraction circuit 44 (or extraction circuit 43)→control circuit 46).

The sampler 55i is electrically connected to the DFE circuit 3, the SIPO circuit 54, and the DFE adjustment circuit 53. As for the sampler 55i, a first input node (data input node) thereof is connected to the DFE circuit 3, a second input node (clock node) thereof is connected to the CDR circuit 4i, and an output node thereof is connected to the SIPO circuit 54. The identification circuit 56i is electrically connected between the SIPO circuit 54, and the control circuit 46, the CTLE adjustment circuit 52, and the DFE adjustment circuit 53. As for the identification circuit 56i, an input node thereof is connected to the SIPO circuit 54, and an output node thereof is connected to the control circuit 46, the CTLE adjustment circuit 52, and the DFE adjustment circuit 53.

Figure 12:
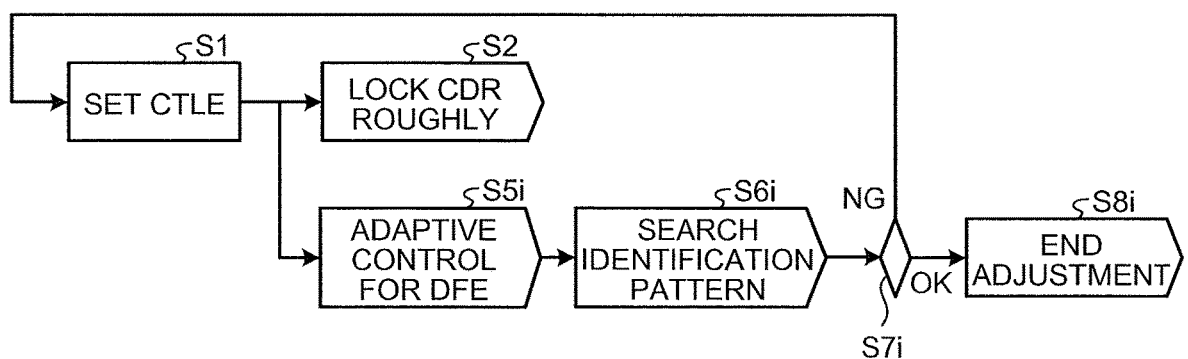
FIG. 12 is a flowchart illustrating an operation of the semiconductor integrated circuit according to the modification example of the embodiment.
Figure 13:
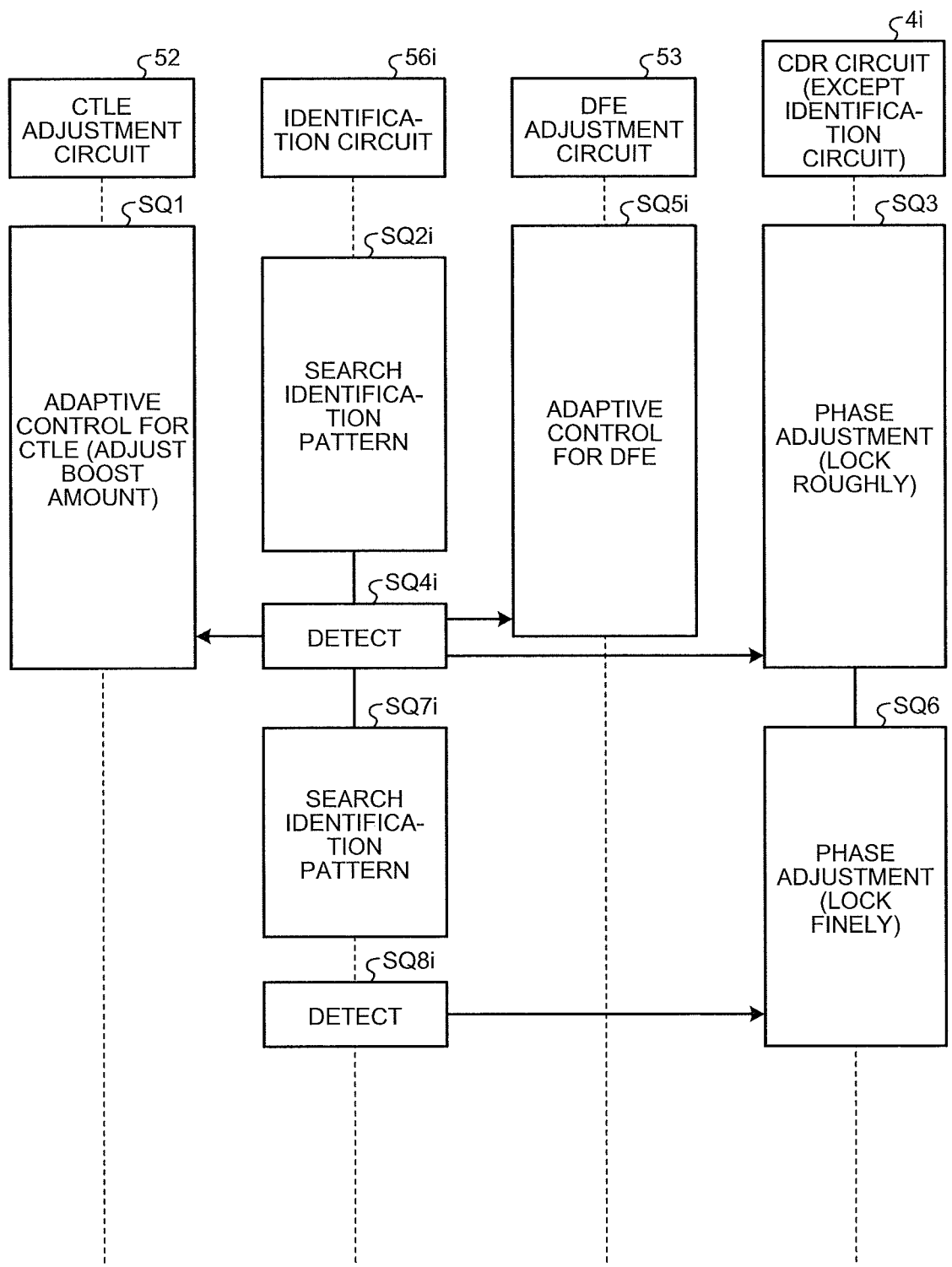
FIG. 13 is a sequence chart illustrating the operation of the semiconductor integrated circuit according to the modification example of the embodiment.

Also, an operation of the semiconductor integrated circuit 1i differs from that of the embodiment in the following respects as illustrated in FIGS. 12 and 13. FIG. 12 is a flowchart illustrating the operation of the semiconductor integrated circuit 1i according to the modification example of the embodiment. FIG. 13 is a sequence chart illustrating the operation of the semiconductor integrated circuit 1i according to the modification example of the embodiment.

After the processing (S1) similar to that in FIG. 8, the semiconductor integrated circuit 1i performs adaptive control (S5i) for making the correction amount of the DFE circuit 3 appropriate in parallel with the phase adjustment (S2) for locking the CDR circuit 4i roughly. The semiconductor integrated circuit 1i searches the identification pattern by means of the identification circuit 56i (S6i) and repeats S1 to S6i until a third condition is satisfied (NG in S7i). The third condition may be a condition in which the identification pattern is detected once, a condition in which the consecutive number of times of detection of the identification pattern is m or higher, or a condition in which the estimated bit error rate calculated based on information about detection and loss of the identification pattern is a third threshold value or higher. The third threshold value may be $1 \times 10^{-12}$, for example.

When the third condition is satisfied (OK in S7i), the semiconductor integrated circuit 1i recognizes that the CDR circuit 4i has been locked roughly, ends the adaptive control for the CTLE circuit 2 and the adaptive control for the DFE circuit 3, and starts phase adjustment for locking the CDR circuit 4i finely with use of all of the edges in the CDR circuit 4i. When the CDR circuit 4i has been locked finely, the semiconductor integrated circuit 1i ends the adjustment processing (S8i).

According to the sequence chart in FIG. 13, the adaptive control for the CTLE circuit 2 by means of the CTLE adjustment circuit 52 (SQ1), the adaptive control for the DFE circuit 3 by means of the DFE adjustment circuit 53 (SQ5i), and the rough phase adjustment in the CDR circuit 4i with use of the pair containing a low-frequency component (SQ3) are started almost at the same time, and the search of the identification pattern by means of the identification circuit 56i (SQ2i) is started slightly later than SQ1, SQ5i, and SQ3. Thereafter, SQ1, SQ2i, SQ5i, and SQ3 are executed in parallel. When the identification pattern is detected in the identification circuit 45 (SQ4i), SQ1, SQ5i, and SQ3 end, and phase adjustment in the CDR circuit 4i is switched from the rough adjustment (SQ3) to the fine adjustment (SQ6). The search of the identification pattern by means of the identification circuit 56i (SQ7i) is started again slightly later than SQ6. Thereafter, SQ7i and SQ6 are executed in parallel. When the identification pattern is detected in the identification circuit 56i (SQ8i), SQ6 ends, and the adjustment processing ends.

In this manner, in the semiconductor integrated circuit 1i, a sequence of coefficient change of the CTLE circuit 2 and the CDR circuit 4i and a sequence of coefficient change of the DFE circuit 3 can be controlled separately. Consequently, time from activation to making the DFE circuit 3 appropriate can be shortened. Also, since fine phase adjustment in the CDR circuit 4i with use of all of the edges can be completed before completion of making the DFE circuit 3 appropriate, time from activation to completion of the fine phase adjustment can be shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
    a first equalizer configured to boost a data signal; and
    a clock reproduction circuit configured to extract from the boosted data signal information of a pair of a rise edge and a fall edge which are temporarily separated from each other by N or more times (N is an integer of two or higher) as much as a clock cycle, perform a first phase adjustment based on the information about the pair of the rise edge and the fall edge, and reproduce a clock.

2. The semiconductor integrated circuit according to claim 1, wherein
    the clock reproduction circuit includes
        an extraction circuit configured to extract from the boosted data signal, the information of the pair of the rise edge and the fall edge,
        a control circuit configured to determine a control amount for the first phase adjustment based on the information of the pair of the rise edge and the fall edge, and
        a generation circuit configured to generate the clock based on the determined control amount.

3. The semiconductor integrated circuit according to claim 2, wherein
    the control circuit is configured to increase the control amount derived with use of the pair of the rise edge and the fall edge N times, and use the increased amount as the control amount for the first phase adjustment.

4. The semiconductor integrated circuit according to claim 2, wherein
the generation circuit comprises
a charge pump circuit that includes a capacitance element and a variable current source configured to store charge the capacitance element based on a current amount corresponding to the control amount, and
a voltage controlled oscillator circuit configured to generate the clock based on voltage of the capacitance element, and
wherein the determined control amount is a control amount of current to flow in the charge pump circuit.

5. The semiconductor integrated circuit according to claim 2, further comprising:
a detection circuit configured to detect information of edges from the boosted data signal; and
a holding circuit configured to store the detected information of the edge,
wherein the extraction circuit is configured to extract the information of the pair of the rise edge and the fall edge based on the stored information of the edges.

6. The semiconductor integrated circuit according to claim 5, wherein
the holding circuit comprises
a first register configured to store a signal indicating a edge,
a second register configured to store a signal indicating a rise edge, and
a third register configured to store a signal indicating a fall edge.

7. The semiconductor integrated circuit according to claim 1, further comprising:
a first adjustment circuit configured to adjust a boost amount of the first equalizer.

8. The semiconductor integrated circuit according to claim 7, further comprising:
a sampler configured to determine a logical value of the boosted data signal in synchronization with the clock; and
an identification circuit configured to detect an identification pattern contained in the data signal based on a determination result of the sampler,
wherein the first adjustment circuit is configured to end the adjustment of the boost amount based on a detection of the identification pattern, and
wherein the clock reproduction circuit is configured to end the first phase adjustment based on the detection of the identification pattern, and start a second phase adjustment based on information of a plurality of edges extracted from the boosted data signal.

9. The semiconductor integrated circuit according to claim 8, further comprising:
a second equalizer configured to correct the boosted data signal; and
a second adjustment circuit configured to start adjustment of a correction amount of the second equalizer based on the detection of the identification pattern, and end the adjustment of the correction amount of the second equalizer based on a next detection of the identification pattern.

10. The semiconductor integrated circuit according to claim 8, further comprising:
a second equalizer configured to correct the boosted data signal; and
a second adjustment circuit configured to start adjustment of a correction amount of the second equalizer before the detection of the identification pattern, and end the adjustment of the correction amount of the second equalizer based on the detection of the identification pattern.

11. A receiver device comprising:
a semiconductor integrated circuit; and
a circuit configured to receive data output from the semiconductor integrated circuit,
wherein the semiconductor integrated circuit comprises
a first equalizer configured to boost a data signal; and
a clock reproduction circuit configured to extract from the boosted data signal information of a pair of a rise edge and a fall edge which are temporarily separated from each other by N or more times (N is an integer of two or higher) as much as a clock cycle, perform a first phase adjustment based on the information about the pair of the rise edge and the fall edge, and reproduce a clock.

12. The receiver device according to claim 11, wherein
the clock reproduction circuit includes
an extraction circuit configured to extract from the boosted data signal the information of the pair of the rise edge and the fall edge,
a control circuit configured to determine a control amount for the first phase adjustment based on the information about the pair consisting of the rise edge and the fall edge, and
a generation circuit configured to generate the clock based on the determined control amount.

13. The receiver device according to claim 12, wherein
the control circuit is configured to increase the control amount derived with use of the pair of the rise edge and the fall edge N times, and use the increased amount as the control amount for the first phase adjustment.

14. The receiver device according to claim 12, wherein
the generation circuit comprises
a charge pump circuit configured to include a capacitance element and a variable current source configured to store charge the capacitance element based on a current amount corresponding to the control amount, and
a voltage controlled oscillator circuit configured to generate the clock based on voltage of the capacitance element, and
wherein the determined control amount is a control amount of current to flow in the charge pump circuit.

15. The receiver device according to claim 11, wherein
the semiconductor integrated circuit further includes a first adjustment circuit configured to adjust a boost amount of the first equalizer.

16. The receiver device according to claim 15, wherein
the semiconductor integrated circuit further includes
a sampler configured to determine a logical value of the boosted data signal in synchronization with the clock; and
an identification circuit configured to detect an identification pattern contained in the data signal based on a determination result of the sampler,
wherein the first adjustment circuit is configured to end the adjustment of the boost amount based on a detection of the identification pattern, and
wherein the clock reproduction circuit is configured to end the first phase adjustment based on the detection of the identification pattern, and start a second phase adjustment based on information of a plurality of edges extracted from the boosted data signal.

17. A method of controlling a semiconductor integrated circuit comprising:
adjusting a boost amount of a first equalizer configured to boost a data signal; and,
extracting from the data signal boosted by the first equalizer information of a pair of a rise edge and a fall edge which are temporarily separated from each other by N or more times (N is an integer of two or higher) as much as a clock cycle, performing a first phase adjustment based on the information about the pair of the rise edge and the fall edge, and reproducing a clock.

18. The method of controlling the semiconductor integrated circuit according to claim 17, further comprising:
extracting from the boosted data signal the information of the pair of the rise edge and the fall edge,
determining a control amount for the first phase adjustment based on the information of the pair consisting of the rise edge and the fall edge, and
generating the clock based on the determined control amount.

19. The method of controlling the semiconductor integrated circuit according to claim 18, wherein
the determining includes
increasing the control amount derived with use of the pair of the rise edge and the fall edge N times, and using the increased amount as the control amount for the first phase adjustment.

20. The method of controlling the semiconductor integrated circuit according to claim 17, further comprising:
adjusting a boost amount of the first equalizer.

* * * * *